US011469276B2

(12) United States Patent
Jeon et al.

(10) Patent No.: US 11,469,276 B2
(45) Date of Patent: Oct. 11, 2022

(54) OLED DISPLAY APPARATUS INCLUDING FIRST AND SECOND PLURALITIES OF OPPOSITE ELECTRODES HAVING DIFFERENT SHAPES CORRESPONDING TO A DISPLAY AREA AND SENSOR AREA

(71) Applicant: SAMSUNG DISPLAY CO., LTD., Yongin-si (KR)

(72) Inventors: Joohee Jeon, Yongin-si (KR); Gunhee Kim, Yongin-si (KR); Donghyun Kim, Yongin-si (KR); Sanghoon Kim, Yongin-si (KR); Soohyun Moon, Yongin-si (KR); Seungchan Lee, Yongin-si (KR); Sungjin Hong, Yongin-si (KR); Taehoon Yang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 20 days.

(21) Appl. No.: 16/861,902

(22) Filed: Apr. 29, 2020

(65) Prior Publication Data
US 2020/0381495 A1    Dec. 3, 2020

(30) Foreign Application Priority Data
May 27, 2019    (KR) .................. 10-2019-0062053

(51) Int. Cl.
*H01L 27/32* (2006.01)
*H01L 51/56* (2006.01)

(52) U.S. Cl.
CPC ...... *H01L 27/3234* (2013.01); *H01L 27/3262* (2013.01); *H01L 27/3272* (2013.01); *H01L 27/3276* (2013.01); *H01L 51/56* (2013.01); *H01L 2227/323* (2013.01)

(58) Field of Classification Search
CPC ............ H01L 27/3234; H01L 27/3262; H01L 27/3276; H01L 51/5225; H01L 51/56
USPC ......................................................... 257/40
See application file for complete search history.

(56) References Cited

U.S. PATENT DOCUMENTS

| | | | |
|---|---|---|---|
| 9,847,486 B2 | 12/2017 | Park et al. | |
| 9,911,941 B2 | 3/2018 | Choi et al. | |
| 10,109,686 B2 | 10/2018 | Oh et al. | |
| 10,163,984 B1 * | 12/2018 | Ho | G06K 9/2036 |
| 2004/0124770 A1 | 7/2004 | Hayashi et al. | |
| 2014/0110672 A1 | 4/2014 | Hack | |
| 2014/0326965 A1 | 11/2014 | Cho et al. | |

(Continued)

FOREIGN PATENT DOCUMENTS

| | | |
|---|---|---|
| CN | 109119451 | 1/2019 |
| EP | 2341544 | 7/2011 |

(Continued)

*Primary Examiner* — Matthew E. Gordon
(74) *Attorney, Agent, or Firm* — F. Chau & Associates, LLC

(57) ABSTRACT

A display apparatus is described that includes a substrate having a display area and a sensor area, wherein the sensor area includes a transmission area; a plurality of first opposite electrodes arranged to correspond to the display area; and a plurality of second opposite electrodes arranged to correspond to the sensor area and surround the transmission area, wherein a shape of each of the plurality of first opposite electrodes is different from a shape of each of the plurality of second opposite electrodes.

18 Claims, 20 Drawing Sheets

(56) References Cited

U.S. PATENT DOCUMENTS

| | | |
|---|---|---|
| 2017/0278909 A1 | 9/2017 | Agarwal |
| 2017/0373132 A1 | 12/2017 | Choung |
| 2019/0196635 A1 | 6/2019 | Park et al. |
| 2020/0075688 A1 | 3/2020 | Xiao et al. |

FOREIGN PATENT DOCUMENTS

| | | |
|---|---|---|
| EP | 2797115 | 10/2014 |
| EP | 3712946 | 9/2020 |
| KR | 10-1223727 | 1/2013 |
| KR | 10-2016-0130042 | 11/2016 |
| KR | 10-2017-0024182 | 3/2017 |
| KR | 10-2018-0050473 | 5/2018 |
| WO | 2017048478 | 3/2017 |
| WO | 2019095297 | 5/2019 |

\* cited by examiner

OLED DISPLAY APPARATUS INCLUDING FIRST AND SECOND PLURALITIES OF OPPOSITE ELECTRODES HAVING DIFFERENT SHAPES CORRESPONDING TO A DISPLAY AREA AND SENSOR AREA

CROSS-REFERENCE TO RELATED APPLICATION

This application claims the benefit of Korean Patent Application No. 10-2019-0062053, filed on May 27, 2019, in the Korean Intellectual Property Office, the disclosure of which is incorporated by reference in its entirety herein.

BACKGROUND

1. Field

One or more embodiments relate to a display apparatus and a method of manufacturing the same.

2. Description of Related Art

Display devices are found in televisions, computers, mobile electronics, and automobiles, among other examples. Usage of display devices has diversified to include many different settings, leading to increased demand for thinner and lighter displays. However, smaller designs may contribute to a reduction in light transmittance of a display.

Despite the ever-shrinking design of display devices, it is desirable to achieve a high light transmittance. A high light transmittance may correspond to higher quality images, clearer images, and more detailed images. Therefore, there is a need in the art for a high light transmittance and high quality of display apparatuses for use in thinner and lighter displays.

SUMMARY

One or more embodiments include a display apparatus for displaying an image and including a sensor area in which sensors are arranged. However, this objective is an example, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes: a substrate including a display area, and a sensor area, the sensor area including a transmission area; a plurality of first opposite electrodes arranged to correspond to the display area; and a plurality of second opposite electrodes arranged to correspond to the sensor area and surround the transmission area, wherein a shape of each of the plurality of first opposite electrodes is different from a shape of each of the plurality of second opposite electrodes.

Each of the plurality of first opposite electrodes may have the shape of a first quadrangle with a first width in a first direction, and each of the plurality of second opposite electrodes may have the shape of a second quadrangle with a second width in the first direction, wherein projections project from four vertexes of the second quadrangle. The first width may be greater than the second width.

First opposite electrodes adjacent to each other in the first direction, from among the plurality of first opposite electrodes, may overlap each other at an edge of the first quadrangle, and second opposite electrodes adjacent to each other along an edge of the transmission area, from among the plurality of second opposite electrodes, may overlap each other at the projections.

First opposite electrodes adjacent to each other in a second direction crossing the first direction, from among the plurality of first opposite electrodes, may be arranged to be apart from each other.

The display apparatus may further include a plurality of third opposite electrodes between the plurality of first opposite electrodes and the plurality of second opposite electrodes, wherein an area of each of the plurality of third opposite electrodes is greater than an area of each of the plurality of first opposite electrodes.

Each of the plurality of first opposite electrodes may have a shape of a first quadrangle with a first width in a first direction, each of the plurality of third opposite electrodes may have a shape of a third quadrangle with a third width in the first direction, and the first width and the third width may be substantially the same as each other.

A plurality of main pixels may be included in the display area, a plurality of auxiliary pixels may be included in the sensor area, and the number of the main pixels covered by each of the plurality of first opposite electrodes may be the same as the number of the auxiliary pixels covered by each of the plurality of second opposite electrodes.

A plurality of main pixels may be included in the display area, a plurality of auxiliary pixels may be included in the sensor area, and the number of the main pixels covered by each of the plurality of first opposite electrodes may be twice the number of the auxiliary pixels covered by each of the plurality of second opposite electrodes.

A length of each of the plurality of first opposite electrodes in a second direction may be 1.8 to 2 times a length of each of the plurality of second opposite electrodes in the second direction.

An area of an area of the transmission area may be greater than an area of an emission area of an auxiliary pixel arranged in the sensor area. The transmission area may include a first transmission area and a second transmission area, and the first transmission area may have a different size from the second transmission area. A width of the transmission area in a first direction may be greater than a width of each of the plurality of second opposite electrodes in the first direction.

The substrate may further include a power supply line arranged in a non-display area outside the display area, and one or more of the plurality of first opposite electrodes and one or more of the plurality of second opposite electrodes may be arranged to overlap the power supply line.

The display apparatus may further include a component arranged to correspond to a lower portion of the sensor area. An auxiliary thin-film transistor may be arranged in the sensor area, and a lower metal layer may be arranged between the substrate and the auxiliary thin-film transistor.

According to one or more embodiments, a method of manufacturing a display apparatus including a display area, and a sensor area, wherein the sensor area includes a transmission area includes: aligning a mask to correspond to a substrate; performing a first operation of depositing a portion of an opposite electrode on the substrate using the mask; and performing a second operation of depositing another portion of the opposite electrode by moving the mask in a first direction and a second direction crossing the first direction.

The mask may include first mask openings and second mask openings, and a shape of each of the first mask openings may be different from a shape of each of the second mask openings.

Each of the first mask openings may have the shape of a first quadrangle with a first width, and each of the second mask openings may have the shape of a second quadrangle with a second width, wherein the second quadrangle has an expansion hole extending from each of four vertexes of the second quadrangle.

The mask may include third mask openings between first mask openings and second mask openings, and an area of each of the third mask openings may be greater than an area of each of the first mask openings.

The first mask openings may be arranged to be apart from each other by a first distance in the second direction, and the second mask openings may be arranged to be apart from each other by a second distance in the second direction, wherein the first distance is less than the second distance. The second distance may be about 5 to 10 times the first distance.

According to one or more embodiments, a display apparatus includes: a substrate including a display area and a non-display area around the display area; an opposite electrode arranged to correspond to the display area; and a power supply line arranged in the non-display area, wherein the opposite electrode extends to the non-display area to overlap the power supply line, and a side of the opposite electrode includes partially projecting exterior patterns.

The opposite electrode may include a plurality of first opposite electrodes and a plurality of second opposite electrodes, wherein first opposite electrodes adjacent to each other in a first direction, from among the plurality of first opposite electrodes, may overlap each other, and the plurality of first opposite electrodes may have a different shape or a different size from the plurality of second opposite electrodes.

Some of the exterior patterns may have the same shape as the plurality of first opposite electrodes and the others of the exterior patterns may have the same shape as the plurality of second opposite electrodes.

The display apparatus may further include: a planarization layer arranged on the power supply line and including a contact hole exposing a portion of the power supply line; and a connection wire arranged on the planarization layer and connected to the power supply line through the contact hole, wherein the opposite electrode contacts the connection wire.

The substrate may further include a sensor area including a transmission area, and a distance by which exterior patterns arranged outside the sensor area, from among the exterior patterns, are apart from each other may be greater than a distance by which exterior patterns arranged outside the display area, from among the exterior patterns, are apart from each other.

According to one or more embodiments, a display apparatus comprises a substrate including a display area and a sensor area with respect to a plan view, the sensor area including at least one transmission area; a plurality of first opposite electrodes having a first shape and overlapping the display area in the plan view; and a plurality of second opposite electrodes having a second shape different from the first shape and overlapping the sensor area in the plan view, wherein the at least one transmission area borders the plurality of second opposite electrodes on at least two opposite sides in the plan view.

In some examples, the second shape comprises a rectangle with a notch on each side, and wherein the notch on at least one side of at least two of the plurality of second opposite electrodes borders the at least one transmission area in the plan view, wherein a portion of the transmission area corresponds to the notch on at least one side of the at least two of the plurality of second opposite electrodes.

In some examples the display apparatus further comprises a plurality of third opposite electrodes having a third shape, wherein each of the plurality of third opposite electrodes borders a boundary between the display area and the sensor area in the plan view and overlaps at least one of the plurality of first opposite electrodes or at least one of the plurality of second opposite electrodes.

BRIEF DESCRIPTION OF THE DRAWINGS

A display apparatus having various functions and improved quality is provided. The display apparatus, the pixel portion, and the transmission area provide for improved light transmittance and may be arranged in the sensor area SA corresponding to the component The above and other aspects, features, and advantages of certain embodiments of the disclosure will be more apparent from the following description taken in conjunction with the accompanying drawings, in which.

DETAILED DESCRIPTION

Figure 1:
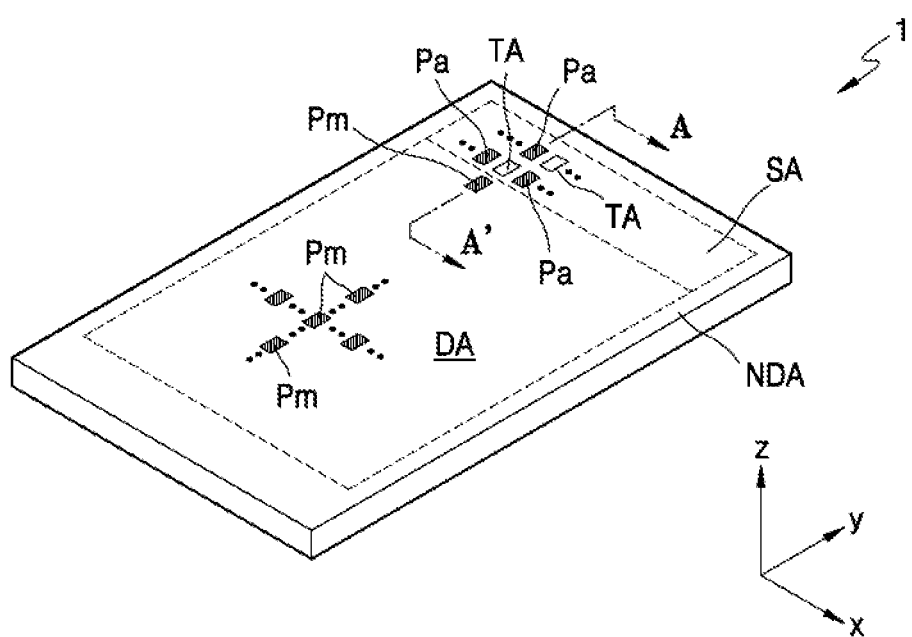
FIG. 1 is a perspective view schematically illustrating a display apparatus according to an embodiment.

While various modifications may be made to and numerous embodiments may be included in the disclosure, embodiments of the disclosure are shown by way of example in the drawings and are herein described in detail. Effects and characteristics of the disclosure and the methods of achieving the effects and the characteristics will be clearly shown with reference to the embodiments described in detail below, together with the drawings. However, the disclosure is not limited to the embodiments described herein and may be realized in various forms.

Hereinafter, the embodiments of the disclosure will be described in detail with reference to the accompanying drawings. In the descriptions, like reference numerals refer to the like elements and the same descriptions will not be repeated.

It will be understood that the terms "first," "second," etc. may be used herein to describe various components; these components should not be limited by these terms. These components are used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, area, or component is referred to as being "formed on," another layer, area, or component, the layer, area, or component can be directly or indirectly formed on the other layer, area, or component. For example, intervening layers, areas, or components may be present.

The sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, the element, area, or layer can be directly or indirectly connected to the other element, area, or layer. For example, it will be understood in this specification that when an element, an area, or a layer is referred to as being in contact with or being electrically connected to another element, area, or layer, the element, area, or layer can be directly or indirectly in contact with or electrically connected to the other element, area, or layer.

FIG. 1 is a perspective view schematically illustrating a display apparatus 1 according to an embodiment.

Referring to FIG. 1, the display apparatus 1 may include a display area DA for realizing an image and a non-display area NDA not for realizing an image. The display apparatus 1 may provide a main image by using pieces of light emitted from a plurality of main pixels Pm arranged in the display area DA.

The display apparatus 1 may include a sensor area SA. A sensor area SA may be an area under which a component where a sensor may exist. The sensor may use infrared rays, visible rays, sound, or the like, which is described below with reference to FIG. 2. The sensor area SA may include a transmission area TA through which light or sound output from the component to the outside or proceeding from the outside toward the component may be transmitted. According to an embodiment, when infrared rays are transmitted through the sensor area SA, a light transmittance may be equal to or greater than about 30%. The light transmittance may be equal to or greater than about 50%, about 75%, about 80%, about 85%, or about 90%.

According to the present embodiment, a plurality of auxiliary pixels Pa may be arranged in the sensor area SA. A certain image may then be provided by using light emitted from the plurality of auxiliary pixels Pa. The image provided in the sensor area SA may be a sub-image and may have a lower resolution than an image provided by the display area DA. For example, because the sensor area SA includes a transmission area TA through which the light and/or the sound may be transmitted, the number of auxiliary pixels Pa, which may be arranged per unit area in the sensor area SA, may be smaller than the number of main pixels Pm. The main pixels Pm may be arranged per unit area in the display area DA.

The sensor area SA may be disposed at a side of the display area DA. According to an embodiment, FIG. 1 illustrates that the sensor area SA is disposed at an upper side of the display area DA. Additionally, the sensor area SA is disposed between the non-display area NDA and the display area DA.

Hereinafter, an organic light-emitting display apparatus is described as an example of the display apparatus 1 according to an embodiment. However, display apparatuses, according to embodiments, are not limited thereto. According to another embodiment, various types of display apparatuses may be used, such as an inorganic light-emitting display apparatus, a quantum dot light-emitting display apparatus, etc.

FIG. 1 illustrates that the sensor area SA is arranged at the upper side of the display area DA, having a quadrangular shape. However, embodiments are not limited thereto. The display area DA may have a circular shape, an oval shape, or a polygonal shape. A polygonal shape may include, but not limited to, a triangular shape or a pentagonal shape. A location of the sensor area SA and the number of sensor areas SA may be variously modified.

Figure 2:
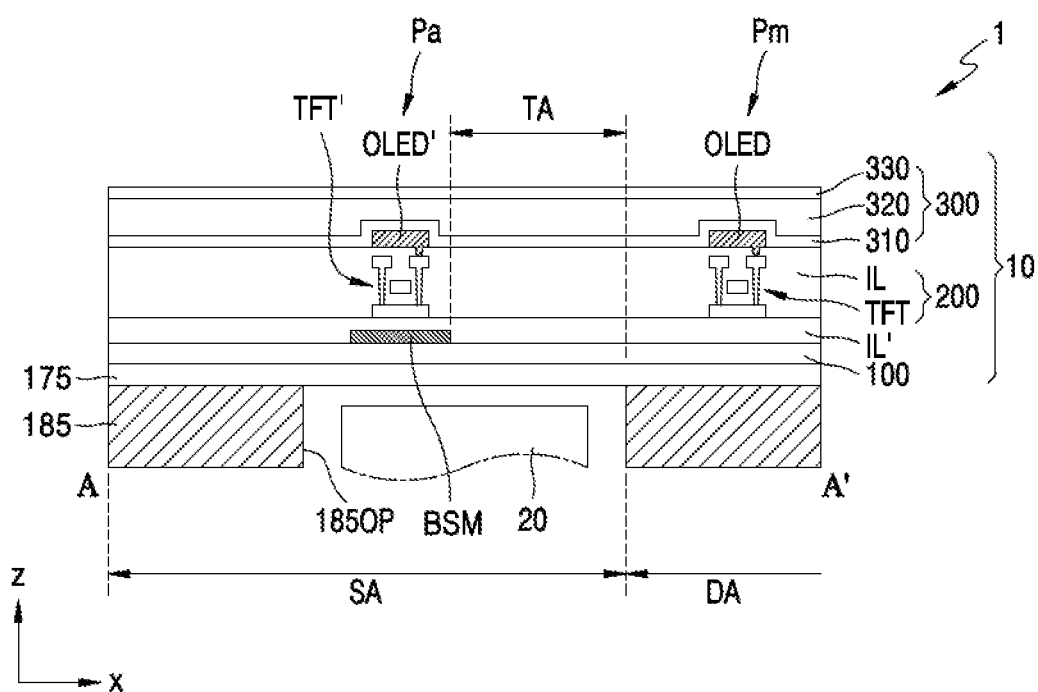
FIG. 2 is a cross-sectional view simply illustrating a display apparatus according to embodiments.

FIG. 2 is a cross-sectional view simply illustrating the display apparatus 1 according to embodiments and may correspond to a cross-section taken along line A-A' of FIG. 1.

Referring to FIG. 2, the display apparatus 1 may include a display panel 10 including a display element, and a component 20 corresponding to the sensor area SA.

The display panel 10 may include a substrate 100, a display element layer 200 arranged on the substrate 100, and a thin-film encapsulation layer 300. The thin-film encapsulation layer 300 is an encapsulation member, encapsulating the display element layer 200. Also, the display panel 10 may further include a lower protective film 175 arranged under the substrate 100, and a lower covering layer 185.

The substrate 100 may include glass or polymer resins. The polymer resins may include polyethersulfone (PES), polyacrylate, polyetherimide (PEI), polyethylene n naphthalate (PEN), polyethylene terephthalate (PET), polyphenylene sulfide (PPS), polyarylate, polyimide (PI), polycarbonate (PC), cellulose acetate propionate (CAP), or the like. The substrate 100, including the polymer resins, may have the flexible, rollable, or bendable characteristics. The substrate 100 may have a multi-layered structure including a layer including the polymer resins described above and an inorganic layer (not shown).

The display element layer 200 may include a circuit layer including thin-film transistors TFT and TFT', an organic light-emitting diode OLED as a display element, and insulating layers IL and IL' between the main and auxiliary thin-film transistors TFT and TFT' and the organic light-emitting diode OLED.

The main pixel Pm may be arranged in the display area DA. The main pixel Pm includes the main thin-film transistor TFT and the organic light-emitting diode OLED connected to the main thin-film transistor TFT. The auxiliary pixel Pa may be arranged in the sensor area SA. The auxiliary pixel Pa may include the auxiliary thin-film transistor TFT' and the organic light-emitting diode OLED connected to the auxiliary thin-film transistor TFT'.

Also, the transmission area TA in which the auxiliary thin-film transistor TFT' and the display element are not arranged may be disposed in the sensor area SA. The transmission area TA may be an area through which the light/signal emitted from the component 20 or the light/signal incident into the component 20 is transmitted.

The component 20 may be located in the sensor area SA. The component 20 may include an electronic element using light or sound. For example, the component 20 may include a sensor configured to receive and use light, a sensor configured to output and sense light or sound, a small-sized lamp configured to output light, a speaker configured to output sound, or the like. A sensor configured to receive and use light may include an infrared sensor. A sensor configured to output and sense light or sound may be used to measure a distance, or recognize a fingerprint, or the like. The electronic element using light may use lights of various wavelength ranges, such as visible rays, infrared rays, ultraviolet rays, etc. The component 20 arranged in the sensor area SA may be provided in a multiple number. For example, the component 20 may be a light-emission device and a light-reception device and may be provided together in the sensor area SA. Alternatively, a light-emission portion and a light-reception portion may be simultaneously included in the component 20.

A lower metal layer BSM may be arranged in the sensor area SA. The lower metal layer BSM may be arranged to correspond to a lower portion of the auxiliary thin-film transistor TFT'. The lower metal layer BSM may prevent external light from reaching the auxiliary pixel Pa including the auxiliary thin-film transistor TFT', etc. For example, the lower metal layer BSM may prevent the light emitted from the component 20 from reaching the auxiliary pixel Pa, or vice versa (i.e., it may prevent the light emitted from the auxiliary pixel Pa from reaching the component 20).

In some embodiments, a constant voltage or a signal may be applied to the lower metal layer BSM to prevent damage to a pixel circuit caused by an electrostatic discharge.

The thin-film encapsulation layer 300 may include at least one inorganic encapsulation layer and at least one organic encapsulation layer. With respect to this aspect, FIG. 2 illustrates first and second inorganic encapsulation layers 310 and 330 and an organic encapsulation layer 320 therebetween.

The first inorganic encapsulation 310 and the second inorganic encapsulation layer 330 may include one or more inorganic insulating materials such as, but are not limited to, aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include acryl-based resins, epoxy-based resins, PI, and polyethylene.

The lower protective film 175 may be coupled under the substrate 100 to support and protect the substrate 100. The lower protective film 175 may include a material having a higher transmittance of light. The lower protective film 175 may include PET or PI.

The lower covering layer 185 may further be provided under the lower protective film 175. The lower covering layer 185 may include an opening 185OP corresponding to the sensor area SA. The lower covering layer 185 may include the opening 185OP to improve the light transmittance of the sensor area SA. The lower covering layer 185 may include a light-blocking material. Accordingly, external light which may be transmitted through a lower surface of the substrate 100 may be blocked.

The sensor area SA may have a greater area than an area in which the component 20 is arranged. Thus, an area of the opening 185OP provided in the lower covering layer 185 may not correspond to an area of the sensor area SA. For example, the area of the opening 185OP may be less than the area of the sensor area SA.

Also, a plurality of component 20 may be arranged in the sensor area SA. The plurality of component 20 may have different functions from one another.

Although not shown, a touch sensing member, a reflection preventing member, and a transparent window may further be arranged on the display panel 10. The touch sensing member may sense a touch input. The reflection preventing member may include a polarizer and a retarder, or a color filter and a black matrix.

According to the present embodiment, it is illustrated that the thin-film encapsulation layer 300 is used as an encapsulation member for encapsulating the display element layer 200. However, embodiments are limited thereto. For example, as the member for encapsulating the display element layer 200, an encapsulation substrate coupled to the substrate 100 by a sealant or frit may also be used.

Figure 3:
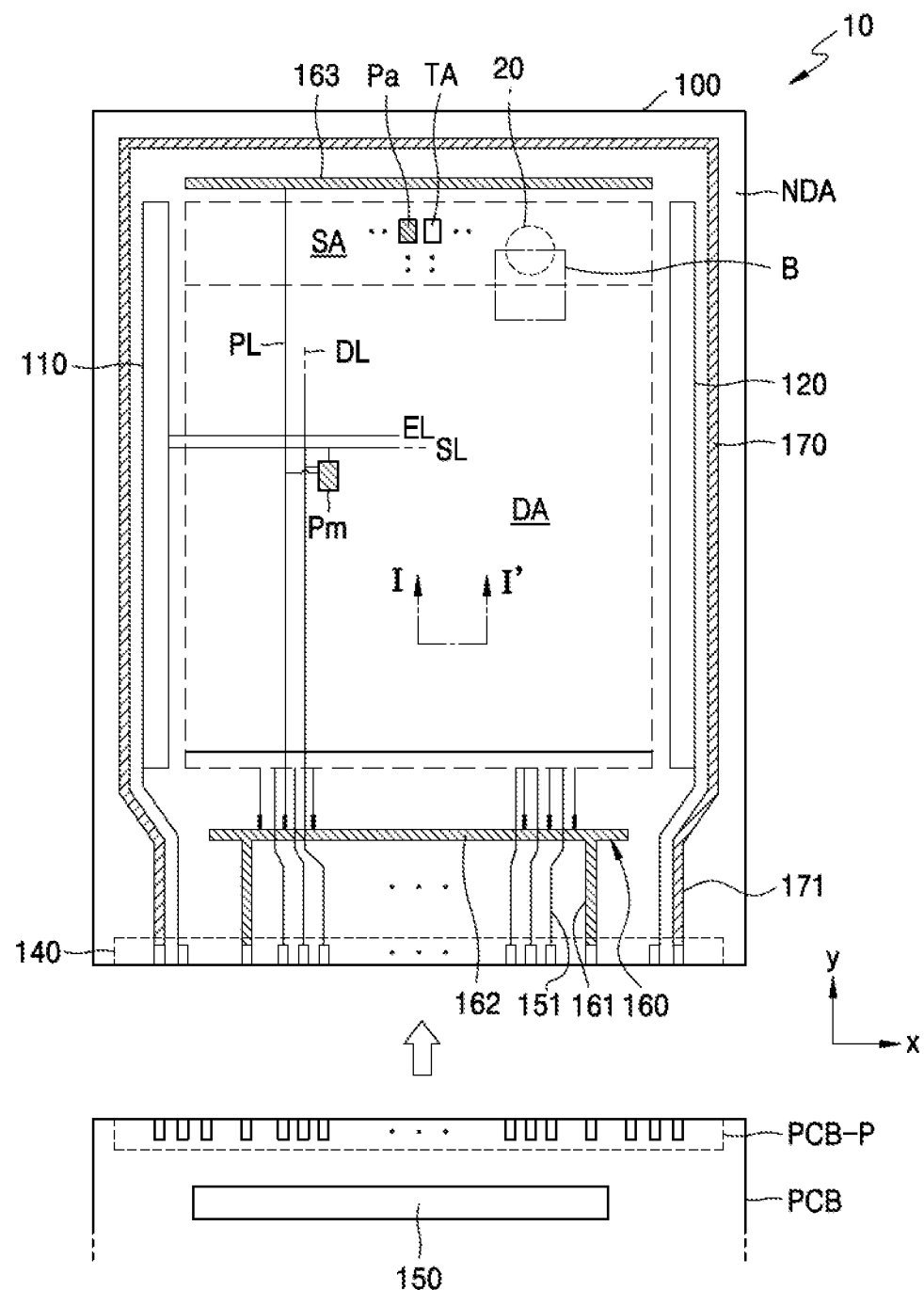
FIG. 3 is a plan view schematically illustrating a display panel according to an embodiment.

FIG. 3 is a plan view schematically illustrating the display panel 10 according to an embodiment.

Referring to FIG. 3, the display panel 10 may be disposed in the display area DA and may include a plurality of main pixels Pm. Each of the main pixels Pm may include a display element, such as an organic light-emitting diode OLED. Each main pixel Pm may emit, for example, red, green, blue, or white light through the organic light-emitting diode OLED. In this specification, the main pixel Pm may be a sub-pixel emitting any of red light, green light, blue light, and white light as described above. The display area DA may be covered by the encapsulation member described above with reference to FIG. 2 and may be protected from external materials, moisture, etc.

The sensor area SA may be disposed at a side of the display area DA, and a plurality of auxiliary pixels Pa may be arranged in the sensor area SA. Each of the auxiliary pixels Pa may include a display element, such as an organic light-emitting diode OLED. Each auxiliary pixel Pa may emit, for example, red, green, blue, or white light through the organic light-emitting diode OLED. In this specification, the auxiliary pixel Pa may be a sub-pixel emitting any of red light, green light, blue light, and white light, as described above. The transmission area TA may be disposed between the auxiliary pixels Pa in the sensor area SA. At least one component 20 may be arranged to correspond to a lower portion of the sensor area SA of the display panel 10.

According to an embodiment, one main pixel Pm and one auxiliary pixel Pa may include the same pixel circuit. However, embodiments are not limited thereto. A pixel circuit included in the main pixel Pm and a pixel circuit included in the auxiliary pixel Pa may be different from each other.

Because the sensor area SA includes the transmission area TA, the resolution of the sensor area SA may be lower than the resolution of the display area DA. For example, the resolution of the sensor area SA may be about a half of the resolution of the display area DA. In some embodiments, the resolution of the display area DA may be equal to or greater than about 400 ppi, and the resolution of the sensor area SA may be equal to or greater than about 200 ppi.

Each of the main pixels Pm and the auxiliary pixels Pa may be electrically connected to outer circuits arranged in the non-display area NDA. A first scan driving circuit 110, a second scan driving circuit 120, a terminal 140, a data driving circuit 150, a first power supply line 160, and a second power supply line 170 may be arranged in the non-display area NDA.

The first scan driving circuit 110 may provide a scan signal to each of the main pixels Pm and the auxiliary pixels Pa through a scan line SL. The first scan driving circuit 110 may provide an emission control signal to each of the main pixels Pm and the auxiliary pixels Pa through an emission control line EL. The second scan driving circuit 120 may be arranged in parallel with the first scan driving circuit 110 with the display area DA therebetween. Some of the main pixels Pm arranged in the display area DA may be electrically connected to the first scan driving circuit 110. Others of the main pixels Pm arranged in the display area DA may be electrically connected to the second scan driving circuit 120. For example, main pixels Pm may alternate between those that connect to the first scan driving circuit 110 and those that connect to the second scan driving circuit 120. Other connecting patterns may also be used. According to another embodiment, the second scan driving circuit 120 may be omitted.

Terminal 140 may be arranged at a side of the substrate 100. The terminal 140 may not be covered by an insulating layer. Additionally, the terminal 140 may be exposed and may be electrically connected to a printed circuit board PCB. A terminal PCB-P of the printed circuit board PCB may be electrically connected to the terminal 140 of the display panel 10. The printed circuit board PCB may transmit a signal or power of a control portion (not shown) to the display panel 10. A control signal generated in the control portion may be transmitted to each of the first and second scan driving circuits 110 and 120 through the printed circuit board PCB. The control portion may provide a first power voltage ELVDD (or a driving voltage) and a second power voltage ELVSS (or a common voltage) (refer to FIGS. 4A and 4B below) to the first power supply line 160 and the second power supply line 170, respectively, through first and second connection wires 161 and 171. The first power voltage ELVDD (or a driving voltage) may be provided to each of the main pixels Pm and the auxiliary pixels Pa through a driving voltage line PL connected to the first power supply line 160. The second power voltage ELVSS (or a common voltage) may be provided to an opposite electrode of each of the main pixels Pm and the auxiliary pixels Pa connected to the second power supply line 170.

The data driving circuit 150 may be electrically connected to a data line DL. A data signal of the data driving circuit 150 may be provided to each of the main pixels Pm and the auxiliary pixels Pa. The data signal is provided through a connection wire 151 connected to the terminal 140 and the data line DL connected to the connection wire 151. FIG. 3 illustrates that the data driving circuit 150 is arranged in the printed circuit board PCB. However, according to another embodiment, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163 extending in parallel with each other in an x-direction with the display area DA therebetween. The second power supply line 170 may have a loop shape with one open side and may partially surround the display area DA.

Figure 4A:
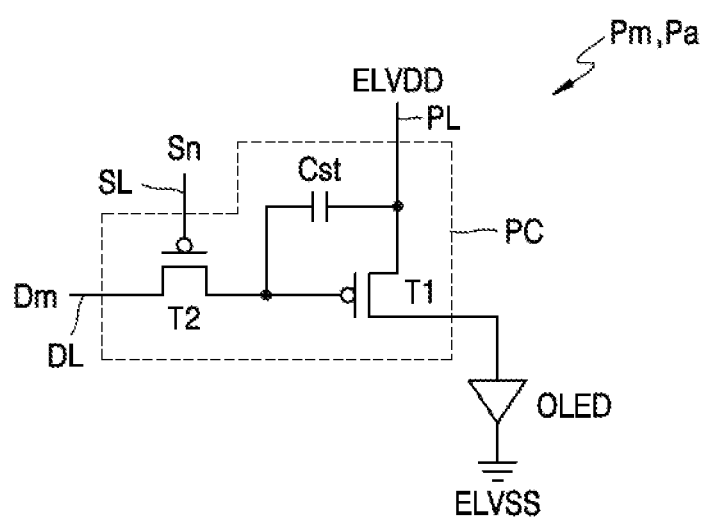
FIG. 4A is an equivalent circuit diagram of an active matrix pixel which may be arranged in a display area of a display apparatus according to an embodiment.
Figure 4B:
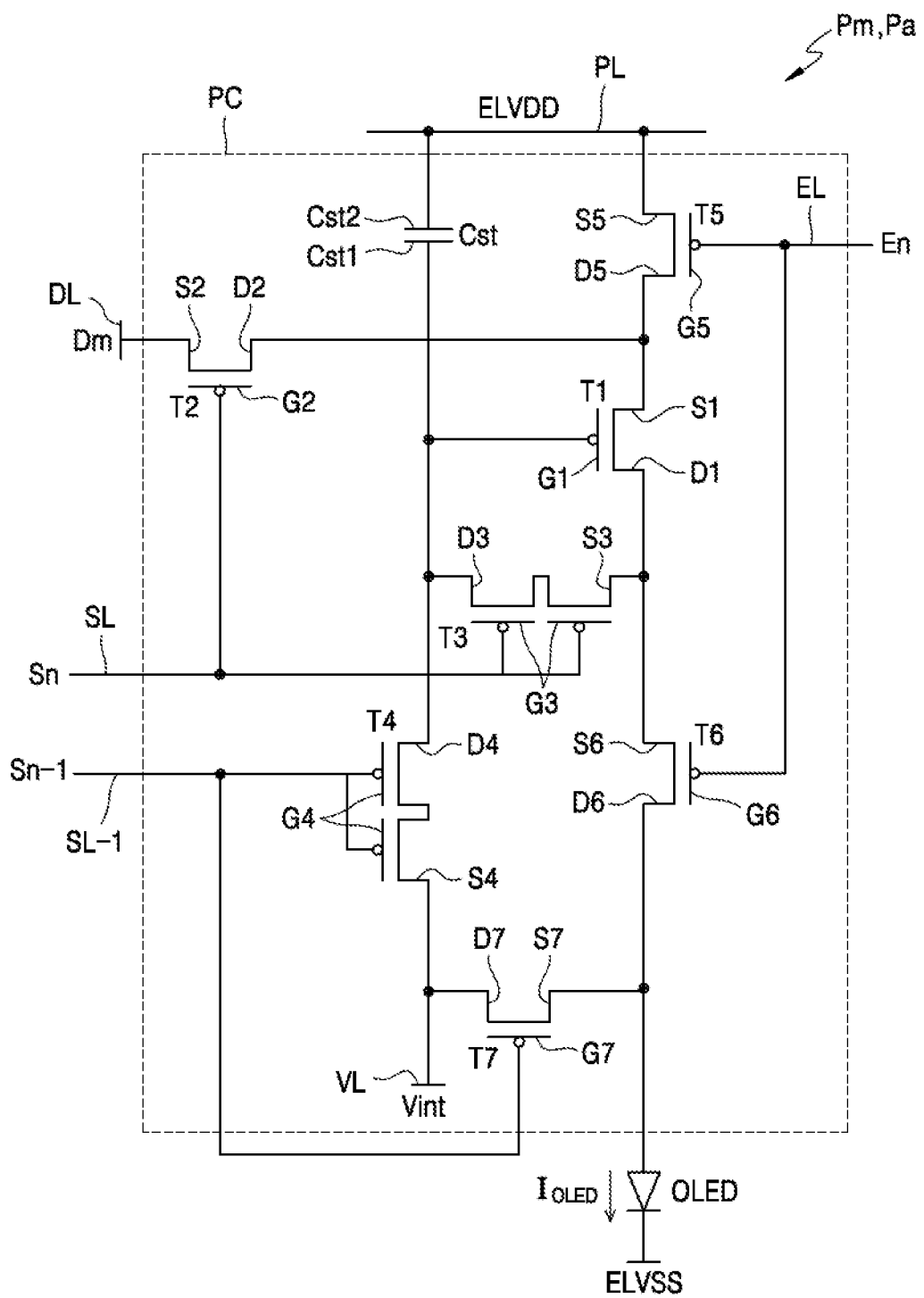
FIG. 4B is an equivalent circuit diagram of an active matrix pixel which may be arranged in a display area of a display apparatus according to another embodiment.

FIGS. 4A and 4B are equivalent circuit diagrams of a main pixel Pm and/or an auxiliary pixel Pa which may be included in a display panel according to an embodiment.

Referring to FIG. 4A, each of the main pixels Pm and the auxiliary pixels Pa may include a pixel circuit PC connected to a scan line SL and a data line DL and an organic light-emitting diode OLED connected to the pixel circuit PC.

The pixel circuit PC may include a driving thin-film transistor T1, a switching thin-film transistor T2, and a storage capacitor Cst. The switching thin-film transistor T2 may be connected to the scan line SL and the data line DL. The switching thin-film transistor T2 may transmit a data signal Dm provided through the data line DL to the driving thin-film transistor T1, in response to a scan signal Sn provided through the scan line SL.

The storage capacitor Cst may be connected to the switching thin-film transistor T2 and a driving voltage line PL. The storage capacitor Cst may store a voltage corresponding to a difference between a voltage received from the switching thin-film transistor T2 and a first power voltage ELVDD (or a driving voltage) supplied to the driving voltage line PL.

The driving thin-film transistor T1 may be connected to the driving voltage line PL and the storage capacitor Cst. Also, the driving thin-film transistor T1 may control a driving current flowing from the driving voltage line PL through the organic light-emitting diode OLED, in correspondence with a voltage value stored in the storage capacitor Cst. The organic light-emitting diode OLED may emit light having a certain brightness, based on the driving current.

It is described in FIG. 4A that the pixel circuit PC includes two thin-film transistors and one storage capacitor. However, embodiments are not limited thereto. As illustrated in FIG. 4B, the pixel circuit PC may include seven thin-film transistors and one storage capacitor.

Referring to FIG. 4B, each of the main pixels Pm and the auxiliary pixels Pa may include a pixel circuit PC and an organic light-emitting diode OLED connected to the pixel circuit PC. The pixel circuit PC may include a plurality of thin-film transistors and a storage capacitor. The thin-film transistors and the storage capacitor may be connected to signal lines SL, SL-1, EL, and DL, an initialization voltage line VL, and a driving voltage line PL.

FIG. 4B illustrates that each of the main pixels Pm and the auxiliary pixels Pa are connected to the signal lines SL, SL-1, EL, and DL. Additionally, the main pixel Pm and the auxiliary pixel Pa are connected to the initialization voltage line VL and the driving voltage line PL. However, embodiments are not limited thereto. According to another embodiment, at least one of the signal lines SL, SL-1, EL, and DL, the initialization voltage line VL, and the driving voltage line PL may be shared by neighboring pixels.

The plurality of thin-film transistors may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The signal lines may include the scan line SL transmitting a scan signal Sn and the scan line SL-1 transmitting a scan signal Sn-1 to the first initialization thin-film transistor T4 and the second initialization thin-film transistor T7. The signal lines may also include the emission control line EL transmitting an emission control signal En to the operation control thin-film transistor T5 and the emission control thin-film transistor T6. The signal lines may also include the data line DL crossing the scan line SL and transmitting a data signal Dm. The driving voltage line PL may transmit a first power voltage ELVDD (or a driving voltage) to the driving thin-film transistor T1. The initialization voltage line VL may transmit an initialization voltage Vint for initializing the driving thin-film transistor T1 and a pixel electrode.

A driving gate electrode G1 of the driving thin-film transistor T1 may be connected to a first storage capacitor plate Cst1 of the storage capacitor Cst. A driving source electrode S1 of the driving thin-film transistor T1 may be connected to a lower driving voltage line PL through the operation control thin-film transistor T5. A driving drain electrode D1 of the driving thin-film transistor T1 may be electrically connected to a pixel electrode of a main organic light-emitting diode OLED through the emission control thin-film transistor T6. The driving thin-film transistor T1 may receive a data signal Dm according to a switching operation of the switching thin-film transistor T2 and supply a driving current $I_{OLED}$ to the main organic light-emitting diode OLED.

A switching gate electrode G2 of the switching thin-film transistor T2 may be connected to the scan line SL. A switching source electrode S2 of the switching thin-film transistor T2 may be connected to the data line DL. A switching drain electrode D2 of the switching thin-film transistor T2 may be connected to the diving source electrode S1 of the driving thin-film transistor T1, and to the lower driving voltage line PL through the operation control thin-film transistor T5. The switching thin-film transistor T2 may be turned on in response to the scan signal Sn transmitted through the scan line SL. Additionally, the switching thin-film transistor T2 may perform a switching operation of transmitting the data signal Dm transmitted through the data line DL to the driving source electrode S1 of the driving thin-film transistor T1.

A compensation gate electrode G3 of the compensation thin-film transistor T3 may be connected to the scan line SL. The compensation source electrode S3 of the compensation thin-film transistor T3 may be connected to the driving drain electrode D1 of the driving thin-film transistor T1 and to the pixel electrode of the organic light-emitting diode OLED through the emission control thin-film transistor T6. A compensation drain electrode D3 of the compensation thin-film transistor T3 may be connected to the first storage capacitor plate Cst1 of the storage capacitor Cst, a first initialization drain electrode D4 of the first initialization thin-film transistor T4, and the driving gate electrode G1 of the driving thin-film transistor T1. The compensation thin-film transistor T3 may be turned on in response to the scan signal Sn received through the scan line SL and may electrically connect the driving gate electrode G1 and the driving drain electrode D1 of the driving thin-film transistor T1 to diode-connect the driving thin-film transistor T1.

A first initialization gate electrode G4 of the first initialization thin-film transistor T4 may be connected to the scan line SL-1. A first initialization source electrode S4 of the first initialization thin-film transistor T4 may be connected to a second initialization drain electrode D7 of the second initialization thin-film transistor T7 and the initialization voltage line VL. A first initialization drain electrode D4 of the first initialization thin-film transistor T4 may be connected to the first storage capacitor plate Cst1 of the storage capacitor Cst, the compensation drain electrode D3 of the compensation thin-film transistor T3, and the driving gate electrode G1 of the driving thin-film transistor T1. The first initialization thin-film transistor T4 may be turned on in response to the scan signal Sn-1 received through the scan line SL-1. The first initialization thin-film transistor T4 may perform an initialization operation of transmitting the initialization voltage Vint to the driving gate electrode G1 of the driving thin-film transistor T1 to initialize the voltage of the driving gate electrode G1 of the driving thin-film transistor T1.

An operation control gate electrode G5 of the operation control thin-film transistor T5 may be connected to the emission control line EL, an operation control source electrode S5 of the operation control thin-film transistor T5 may be connected to the lower driving voltage line PL, and an operation control drain electrode D5 of the operation control thin-film transistor T5 may be connected to the driving source electrode S1 of the driving thin-film transistor T1 and the switching drain electrode D2 of the switching thin-film transistor T2.

An emission control gate electrode G6 of the emission control thin-film transistor T6 may be connected to the emission control line EL, an emission control source electrode S6 of the emission control thin-film transistor T6 may be connected to the driving drain electrode D1 of the driving thin-film transistor T1 and the compensation source electrode S3 of the compensation thin-film transistor T3, and an emission control drain electrode D6 of the emission control thin-film transistor T6 may be electrically connected to a second initialization source electrode S7 of the second initialization thin-film transistor T7 and the pixel electrode of the organic light-emitting diode OLED.

The operation control thin-film transistor T5 and the emission control thin-film transistor T6 may be simultaneously turned-on in response to the emission control signal En received through the emission control line EL so that the first power voltage ELVDD (or a driving voltage) is transmitted to the main organic light-emitting diode OLED, and the driving current $I_{OLED}$ flows in the organic light-emitting diode OLED.

A second initialization gate electrode G7 of the second initialization thin-film transistor T7 may be connected to the scan line SL-1, the second initialization source electrode S7 of the second initialization thin-film transistor T7 may be connected to the emission control drain electrode D6 of the emission control thin-film transistor T6 and the pixel electrode of the main organic light-emitting diode OLED, and a second initialization drain electrode D7 of the second initialization thin-film transistor T7 may be connected to the first initialization source electrode S4 of the first initialization thin-film transistor T4 and the initialization voltage line VL. The second initialization thin-film transistor T7 may be turned on in response to the scan line Sn-1 received through the scan line SL-1 and may initialize the pixel electrode of the main organic light-emitting diode OLED.

FIG. 4B illustrates that the first initialization thin-film transistor T4 and the second initialization thin-film transistor T7 are connected to the scan line SL-1. However, embodiments are not limited thereto. According to another embodiment, the first initialization thin-film transistor T4 may be connected to the scan line SL-1 to be driven in response to the scan signal Sn-1 and the second initialization thin-film transistor T7 may be connected to an additional signal line (for example, a next scan line) to be driven in response to a signal transmitted to the additional signal line.

A second storage capacitor plate Cst2 of the storage capacitor Cst may be connected to the driving voltage line PL, and the opposite electrode of the organic light-emitting diode OLED may be connected to the second power voltage ELVSS (or a common voltage). Accordingly, the organic light-emitting diode OLED may receive the driving current $I_{OLED}$ from the driving thin-film transistor T1 to emit light to display an image.

FIG. 4B illustrates that the compensation thin-film transistor T3 and the first initialization thin-film transistor T4 have dual gate electrodes. However, the compensation thin-film transistor T3 and the first initialization thin-film transistor T4 may have one gate electrode.

According to the present embodiment, the main pixel Pm and the auxiliary pixel Pa may include the same pixel circuit PC. However, embodiments are not limited thereto. The main pixel Pm and the auxiliary pixel Pa may include the pixel circuits PC having different structures. Various modifications are possible. For example, the main pixel Pm may implement the pixel circuit PC of FIG. 4B and the auxiliary pixel Pa may implement the pixel circuit PC of FIG. 4A.

Figure 5:
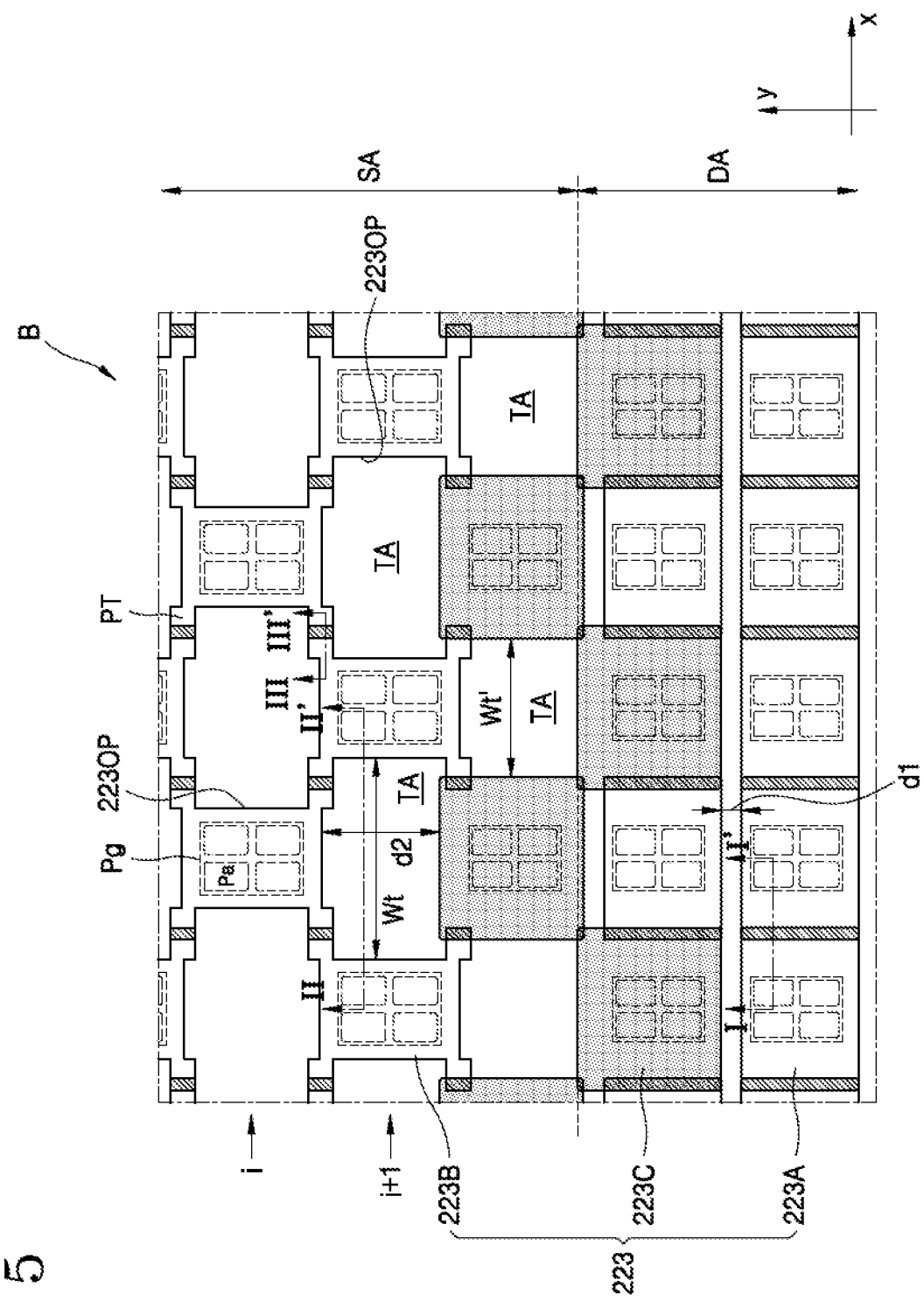
FIGS. 5 and 6 are schematic plan views corresponding to region B of FIG. 3.
Figure 6:
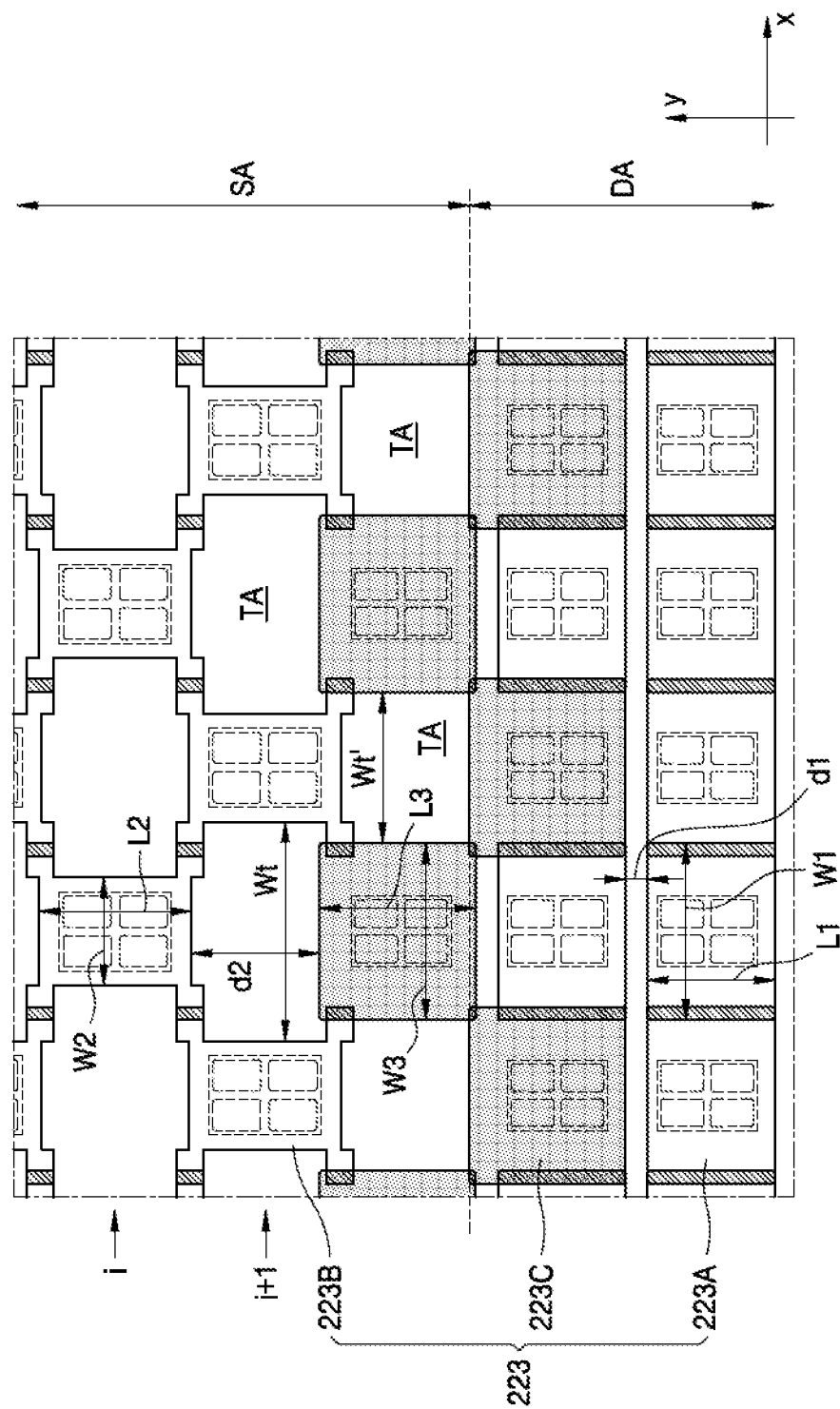
Figure 7:
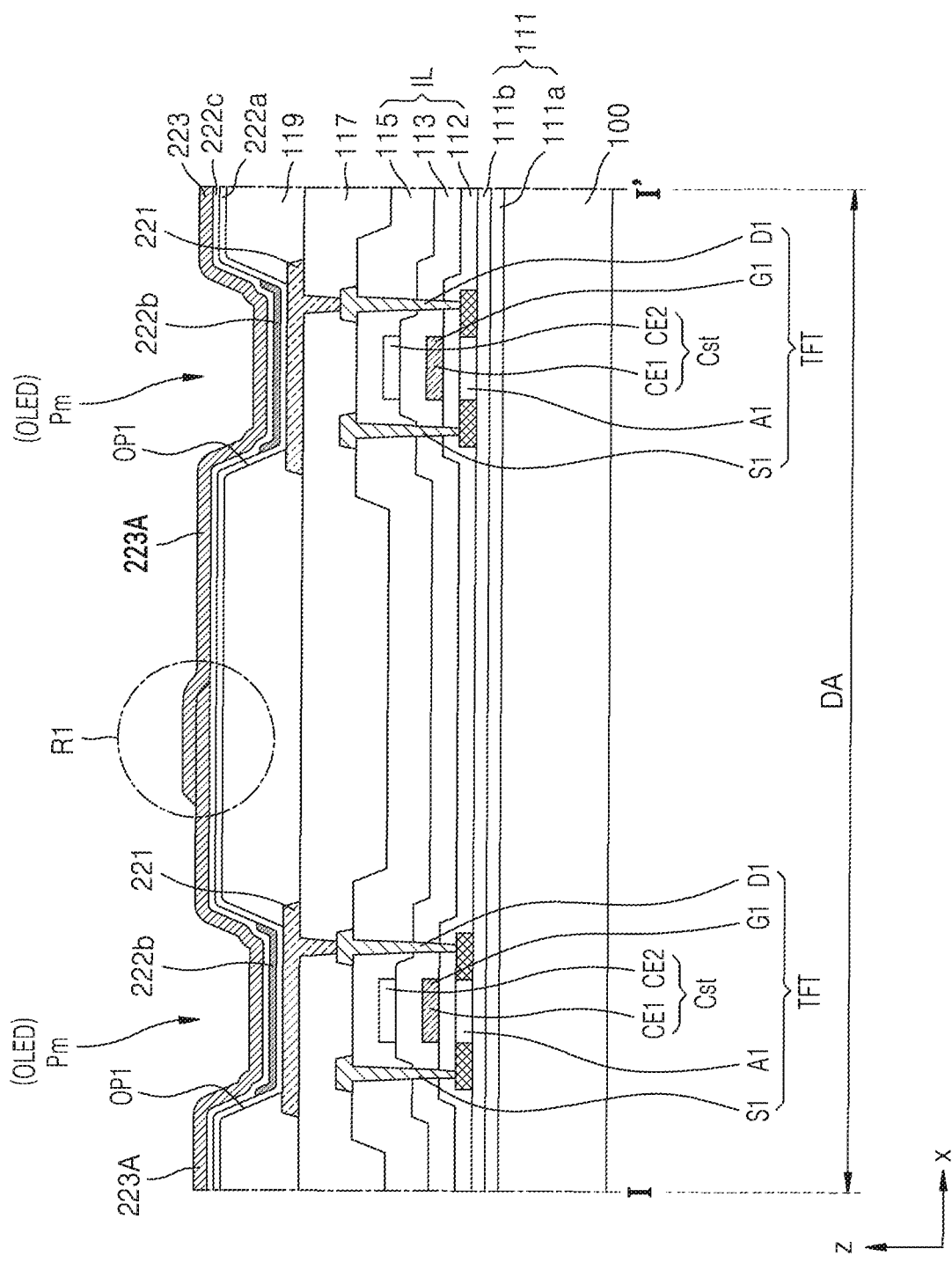
FIG. 7 is a schematic cross-sectional view of the display apparatus taken along line I-I' of FIG. 5.
Figure 8:
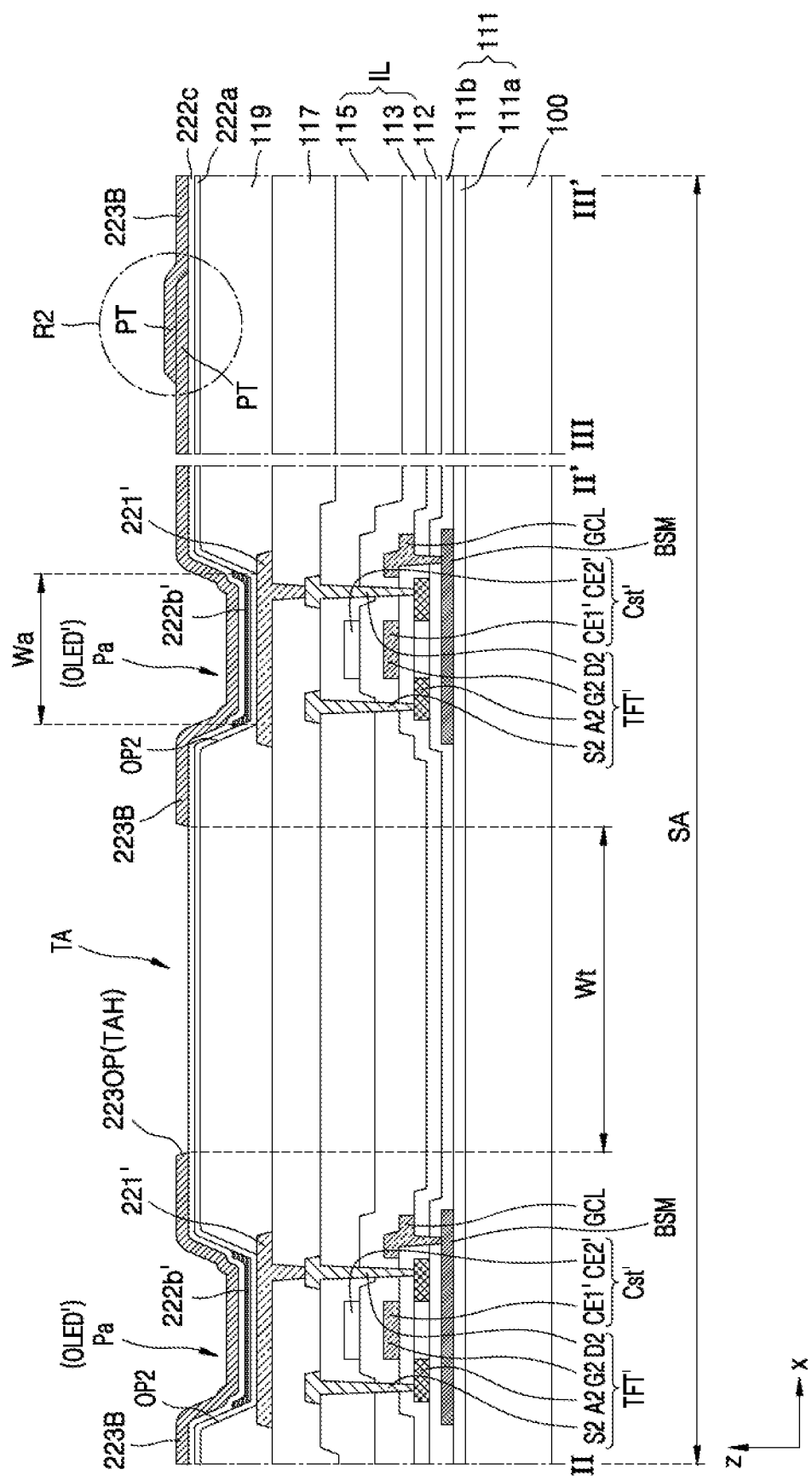
FIG. 8 is a schematic cross-sectional view of the display apparatus taken along lines II-II' and III-III' of FIG. 5.

FIGS. 5 and 6 are schematic plan views corresponding to region B of FIG. 3 and illustrate part of the adjacent edge portions of the display area DA and the sensor area SA. FIG. 7 is a schematic cross-sectional view of the display panel 10 taken along line I-I' of FIG. 5 and FIG. 8 is a schematic cross-sectional view of the display panel 10 taken along lines II-II' and III-III' of FIG. 5.

First, referring to FIGS. 5 and 6, a display apparatus according to an embodiment may include the display area DA and the sensor area SA including the transmission area TA and may include a plurality of opposite electrodes 223. The opposite electrodes 223 may include a plurality of first opposite electrodes 223A arranged to correspond to the display area DA and a plurality of second opposite electrodes 223B arranged to correspond to the sensor area SA, wherein a shape of each of the plurality of first opposite electrodes 223A may be different from a shape of each of the plurality of second opposite electrodes 223B. The opposite electrodes 223 may be connected to one another, and may have a greater thickness at a connection portion.

As used herein, the phrases "correspond to the display area DA" and "correspond to the sensor area SA" may refer to an element of which more than half of the area (in the x-y plane) overlaps with the display area DA or sensor area SA, respectively.

The display apparatus, according to the present embodiment, may further include a plurality of third opposite electrodes 223C arranged to be adjacent to the edge portion of the display area DA and the sensor area SA. For example, the third opposite electrodes 223C may be arranged between the first opposite electrodes 223A and the second opposite electrodes 223B.

Each of the first opposite electrodes 223A, the second opposite electrodes 223B, and the third opposite electrodes 223C may be arranged to correspond to one pixel group Pg.

A pixel group Pg may include at least one pixel Pg (or Pm). FIG. 5 illustrates that one pixel group Pg includes four pixels Pa (or Pm) arranged in two columns. However, embodiments are not limited thereto. The number of pixels Pa (or Pm) included in one pixel group Pg and the arrangement of the pixels Pa (or Pm) may be variously modified.

For example, three pixels Pa (or Pm) arranged in parallel in a column may be included in one pixel group Pg, or eight pixels Pa (or Pm) arranged in four columns may be included in one pixel group Pg. In this specification, the pixels Pa (or Pm) may denote sub-pixels emitting red, green, or blue light.

The transmission area TA may be an area in which a display element is not arranged and thus has a high light transmittance and may. Additionally, the transmission area TA provided in a multiple number in the sensor area SA. The transmission area TA may be alternately arranged with the pixel group Pg in a first direction (x) and/or a second direction (y). Alternatively, the transmission areas TA may be arranged to surround the pixel group Pg. Alternatively, the auxiliary pixels Pa may be arranged to surround the transmission area TA. According to the present embodiment, the transmission area TA may be an area in which neither the first opposite electrodes 223A, the second opposite electrodes 223B, nor the third opposite electrodes 223C are Rat arranged. Instead, the transmission are TA may be an area corresponding to an opening 233OP of the opposite electrode 233 in the sensor area SA.

A size of the transmission area TA may be greater than a size of an emission area of at least one pixel Pa (or Pm). In some embodiments, the size of the transmission area TA may be equal to or greater than a size of one pixel group Pg. According to the present embodiment, the transmission area TA may be provided in a multiple number. In this case, the transmission areas TA may include transmission areas TA having different sizes. For example, as illustrated in FIG. 5, a width Wt of the transmission area TA arranged between the second opposite electrodes 223B, the width Wt being in the first direction (the x-direction), may be greater than a width Wt' of the transmission area TA arranged between the third opposite electrodes 223C, the width Wt' being in the first direction (the x-direction).

The first opposite electrode 223A, second opposite electrode 223B, and third opposite electrodes 223C may be electrically connected to one another. First opposite electrodes 223A adjacent to each other in the first direction (the x-direction) from among the first opposite electrodes 223A may overlap and contact each other at edges thereof. The first opposite electrodes 223A may contact each other in the first direction (the x-direction) and may be electrically connected to the second power supply line 170 (see FIG. 3) of the non-display area NDA. First opposite electrodes 223A adjacent to each other in a second direction (a y-direction) from among the first opposite electrodes 223A may be apart from each other. However, the first opposite electrodes 223A separated from each other are electrically connected to the second power supply line 170 of the non-display area NDA. Thus, the first opposite electrodes 223A may be electrically connected to each other.

The second opposite electrodes 223B may be arranged to surround the transmission area TA. The second opposite electrodes 223B are arranged to be adjacent to each other along an edge of the transmission area TA, from the second opposite electrodes 223B surrounding the transmission area TA and may each have projections PT. Projections PT may project at vertexes of each second opposite electrode 223B, wherein the projections PT of each second opposite electrode 223B may overlap and contact each other. The second opposite electrodes 223B connected to each other may be electrically connected to the second power supply line 170 of the non-display area NDA.

According to the present embodiment, it may be understood that the second opposite electrodes 223B arranged in the first direction (the x-direction) may be arranged to be apart from each other with the transmission area TA therebetween. Additionally, the second opposite electrodes 223B arranged in the second direction (the y-direction) may be arranged to be apart from each other with the transmission area TA therebetween. Here, it may be understood that second opposite electrodes 223B arranged in an $i^{th}$ column may overlap and contact second opposite electrodes 223B arranged in an $i+1^{th}$ column at the projections PT thereof.

The third opposite electrodes 223C may be arranged to be adjacent to the edge portion of the display area DA and the sensor area SA, wherein one or more of the third opposite electrodes 223C may contact the first opposite electrodes 223A of the display area DA. Additionally, one or more of the third opposite electrodes 223C may contact the second opposite electrodes 223B of the sensor area SA.

The third opposite electrodes 223C arranged in the display area DA may be alternately arranged with the first opposite electrodes 223A in the first direction. Here, edges of the third opposite electrodes 223C and edges of the first opposite electrodes 223A may partially overlap and contact each other.

The third opposite electrodes 223C arranged in the sensor area SA may surround the transmission areas TA with the second opposite electrodes 223B. Vertexes of the third opposite electrodes 223C may overlap and contact the projections PT of the second opposite electrodes 223B.

The first opposite electrode 223A, second opposite electrode 223B, and third opposite electrodes 223C may be electrically connected to one another so a uniform second power voltage may be supplied to the entire display area DA.

Based on the shape of the second opposite electrodes 223B, the area of the transmission areas TA may be increased, which increases the light transmittance in the transmission areas TA. For example, the second opposite electrodes 223B may be in the shape of a rectangle with a notched removed from two or more sides. In some cases, a rectangular notch is removed from each of the four sides. The removed notches may enable the size of the transmission areas TA to be increased while enabling the second opposite electrodes 223B to overlap with other second opposite electrodes 223B and, in some cases, third opposite electrodes 223C.

Referring to FIG. 6, shapes of the first opposite electrode 223A, second opposite electrode 223B, and third opposite electrodes 223C are described in detail. Referring to FIG. 6, each of the first opposite electrodes 223A may have a shape of a first quadrangle with a first width W1 in the first direction (the x-direction). Each of the second opposite electrodes 223B may have a shape of a second quadrangle with a second width W2 in the first direction (the x-direction), wherein projections PT project at four vertexes of the second quadrangle. Here, the projections PT may be an area at which adjacent second opposite electrodes 223B overlap each other, and may be smaller than the second quadrangle.

In some embodiments, the first width W1 may be greater than the second width W2. For example, the second width W2 of the second opposite electrode 223B arranged in the sensor area SA is less than the first width W1 of the first opposite electrode 223A arranged in the display area DA. The second width W2 is in the first direction (the x-direction) and the first width W1 is in the first direction (the x-direction). Thus, distances between the second opposite electrodes 223B arranged with the transmission area TA therebetween may be increased. For example, a width Wt of the transmission area TA in the first direction (the x-direction) may be greater than the first width W1. Thus, an area of the transmission area TA, through which light may be transmitted, may be increased. (Wt>W1>W2)

In some embodiments, an area of one third opposite electrode 223C may be greater than an area of one first opposite electrode 223A. To this end, in FIGS. 5 and 6, a third length L3 of the third opposite electrode 223C in the second direction may be greater than a first length L1 of the first opposite electrode 223A in the second direction. Because the third length L3 is greater than the first length L1, the third opposite electrode 223C arranged in the sensor area SA may overlap and contact the first opposite electrode 223A and the second opposite electrode 223B at a vertex area thereof. In FIG. 6, a third width W3 in the first direction (the x-direction) is substantially the same as the first width W1. However, embodiments are not limited thereto. For example, the third width W3 may be greater than the first width W1.

A distance d1 between the first opposite electrodes 223A adjacent to each other in the second direction (the y-direction) from among the first opposite electrodes 223A may be much less than a length d2 of the transmission area TA in the second direction (the y-direction). For example, the length d2 of the transmission area TA may be about five to ten times the distance d1 (d1<<d2). In some embodiments, the distance d1 may be about 10 through about 20 um.

Thus, according to one or more embodiments, a display apparatus 1 comprises a substrate 100 including a display area DA and a sensor area SA with respect to a plan view, the sensor area SA including at least one transmission area TA; a plurality of first opposite electrodes 223A having a first shape and overlapping the display area DA in the plan view; and a plurality of second opposite electrodes 223B having a second shape different from the first shape and overlapping the sensor area SA in the plan view, wherein the at least one transmission area TA borders the plurality of second opposite electrodes 223B on at least two opposite sides in the plan view.

In some examples, the second shape comprises a rectangle with a notch on each side, where the notch on at least one side of at least two of the plurality of second opposite electrodes 223B borders the at least one transmission area TA in the plan view, and where a portion of the transmission area TA corresponds to the notch on at least one side of the at least two of the plurality of second opposite electrodes 223B.

In some examples, the display apparatus 1 further comprises a plurality of third opposite electrodes 223C having a third shape (which may be a rectangle with different dimensions than a rectangle of the first shape), wherein each of the plurality of third opposite electrodes 223C borders a boundary between the display area DA and the sensor area SA in the plan view and overlaps at least one of the plurality of first opposite electrodes 223A or at least one of the plurality of second opposite electrodes 223B.

Hereinafter, referring to FIGS. 7 and 8, a stack structure of a display apparatus according to an embodiment will be described. FIG. 7 is a schematic cross-sectional view of the display apparatus taken along line I-I' of FIG. 5 and illustrates a partial cross-section of a display area DA and FIG. 8 is a schematic cross-sectional view of the display apparatus taken along lines II-II' and III-III' of FIG. 5 and illustrates a partial cross-section of a sensor area SA.

Referring to FIGS. 7 and 8, the display apparatus, according to an embodiment, may include the display area DA and the sensor area SA. A main pixel Pm may be arranged in the display area DA and an auxiliary pixel Pa and a transmission area TA may be arranged in the sensor area SA.

The main pixel Pm may include a main thin-film transistor TFT, a main storage capacitor Cst, and a main organic light-emitting diode OLED. The auxiliary pixel Pa may include an auxiliary thin-film transistor TFT', an auxiliary storage capacitor Cst', and an auxiliary organic light-emitting diode OLED'. The transmission area TA may have a transmission hole TAH to correspond to the transmission area TA.

Hereinafter, a structure in which the components of the display apparatus, according to an embodiment, are stacked will be described.

The substrate 100 may include glass or polymer resins. The polymer resins may include PES, PAR, PEI, PEN, PET, PPS, polyarylate, PI, PC, CAP, or the like. The substrate 100, including the polymer resins, may have the flexible, rollable, or bendable characteristics. The substrate 100 may have a multi-layered structure including a layer including the polymer resins described above and an inorganic layer (not shown).

A buffer layer 111 may be located on the substrate 100, may reduce or prevent penetration of foreign materials, moisture, or foreign substances from below the substrate 100, and may provide a planarization surface on the substrate 100. The buffer layer 111 may include an inorganic material, such as oxide or nitride, an organic material, or an organic and inorganic compound, and may have a single-layered structure or a multi-layered structure including an inorganic material and/or an organic material. A barrier layer (not shown) preventing the penetration of foreign substances may further be included between the substrate 100 and the buffer layer 111. In some embodiments, the buffer layer 111 may include silicon oxide ($SiO_2$) or silicon nitride ($SiN_x$). The buffer layer 111 may include a first buffer layer 111a and a second buffer layer 111b that are stacked.

In the sensor area SA, a lower electrode layer BSM may be arranged between the first buffer layer 111a and the second buffer layer 111b. According to another embodiment, the lower electrode layer BSM may be arranged between the substrate 100 and the first buffer layer 111a. The lower electrode layer BSM may be arranged below the auxiliary thin-film transistor TFT' and may prevent the deterioration of the characteristics of the auxiliary thin-film transistor TFT' caused by the light emitted from the component 20, etc.

Also, the lower electrode layer BSM may be connected to a line GCL arranged in another layer via a contact hole. The lower electrode layer BSM may receive a constant voltage or a signal from the line GCL. For example, the lower electrode layer BSM may receive a first power voltage ELVDD (or a driving voltage) or a scan signal. The lower electrode layer BSM may significantly reduce the probability of the occurrence of electrostatic discharge by receiving the constant voltage or the signal. The lower electrode layer BSM may include Al, Pt, Pd, Ag, Mg, Au, Ni, Nd, Ir, Cr, Li, Ca, Mo, Ti, W, and/or Cu. The lower electrode layer BSM may include a single layer or multiple layers, including the materials described above.

The main thin-film transistor TFT and the auxiliary thin-film transistor TFT' may be arranged on the buffer layer 111. The main thin-film transistor TFT may include a first semiconductor layer A1, a first gate electrode G1, a first source electrode S1, and a first drain electrode D1. The auxiliary thin-film transistor TFT may include a second semiconductor layer A2, a second gate electrode G2, a second source electrode S2, and a second drain electrode D2. The main thin-film transistor TFT may be connected to the main organic light-emitting diode OLED of the display area DA and may drive the main organic light-emitting diode OLED.

The auxiliary thin-film transistor TFT' may be connected to the auxiliary organic light-emitting diode OLED' of the sensor area SA and may drive the auxiliary organic light-emitting diode OLED'.

The first semiconductor layer A1 and the second semiconductor layer A2 may be arranged on the buffer layer 111 and may include polysilicon. According to another embodiment, the first semiconductor layer A1 and the second semiconductor layer A2 may include amorphous silicon. According to another embodiment, the first semiconductor layer A1 and the second semiconductor layer A2 may include oxide of at least one selected from among the group consisting of In, Ga, Sn, Zr, V, Hf, Cd, Ge, Cr, Ti, and Zn. The first semiconductor layer A1 and the second semiconductor layer A2 may include a channel area and a source area and a drain area doped with impurities.

The second semiconductor layer A2 may overlap the lower electrode layer BSM with the second buffer layer 111b therebetween. According to an embodiment, a width of the second semiconductor layer A2 may be less than a width of the lower electrode layer BSM. Thus, when viewed from a direction perpendicular to the substrate 100, the second semiconductor layer A2 may generally overlap the lower electrode layer BSM.

A first gate insulating layer 112 may be included to cover the first semiconductor layer μl and the second semiconductor layer A2. The first gate insulating layer 112 may include an inorganic insulating material, such as $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or multiple layers, including the organic insulating materials described above.

A first gate electrode G1 and a second gate electrode G2 may be arranged on the first gate insulating layer 112 to overlap the first semiconductor layer A1 and the second semiconductor layer A2, respectively. The first gate electrode G1 and the second gate electrode G2 may include Mo, Al, Cu, Ti, etc., and may include a single layer or multiple layers. For example, the first gate electrode G1 and the second gate electrode G2 may include a single layer, including Mo.

A second gate insulating layer 113 may be included to cover the first gate electrode G1 and the second gate electrode G2. The second gate insulating layer 113 may include an inorganic insulating material, such as $SiO_2$, $SiN_x$, SiON, $Al_2O_3$, $TiO_2$, $Ta_2O_5$, $HfO_2$, or $ZnO_2$. The second gate insulating layer 113 may include a single layer or multiple layers, including the organic insulating materials described above.

A first upper electrode CE2 of the main storage capacitor Cst and a second upper electrode CE2' of the auxiliary storage capacitor Cst' may be arranged on the second gate insulating layer 113.

The first upper electrode CE2 may overlap the first gate electrode G1 therebelow in the display area DA. The first gate electrode G1, and the first upper electrode CE2 overlapping each other with the second gate insulating layer 113 therebetween may be included in the main storage capacitor Cst. For example, the first gate electrode G1 may function as a first lower electrode CE1 of the main storage capacitor Cst.

The second upper electrode CE2' may overlap the second gate electrode G2 therebelow in the sensor area SA. The second gate electrode G2 and the second upper electrode CE2' overlapping each other with the second gate insulating layer 113 therebetween may be included in the auxiliary storage capacitor Cst'. The first gate electrode G1 may function as a second lower electrode CE1' of the auxiliary storage capacitor Cst'.

The first upper electrode CE2 and the second upper electrode CE2' may include Al, Pt, Pd, Ag, Mg, Au, Ni, Nd, Ir, Cr, Li, Ca, Mo, Ti, W, and/or Cu and may include a single layer or multiple layers including the materials described above.

An interlayer insulating layer 115 may be formed to cover the first upper electrode CE2 and the second upper electrode CE2'. The interlayer insulating layer 115 may include $SiO_2$, $SiN_x$, SiON, $Al_2O_3$, $TiO_2$, $Ta_2O_5$, $HfO_2$, or $ZnO_2$.

Source electrodes S1 and S2 and drain electrodes D1 and D2 may be arranged on the interlayer insulating layer 115. The source electrodes S1 and S2 and the drain electrodes D1 and D2 may include a conductive material including Mo, Al, Cu, Ti, etc., and may include multiple layers or a single layer including the materials described above. For example, the source electrodes S1 and S2, and the drain electrodes D1 and D2 may include a multi-layered structure, including Ti/Al/Ti.

A planarization layer 117 may be arranged to cover the source electrodes S1 and S2 and the drain electrodes D1 and D2. The planarization layer 117 may have a planarized upper surface so that a first pixel electrode 221 and a second pixel electrode 221' may be formed thereon to be flat.

The planarization layer 117 may include a single layer or multiple layers, including an organic material or an inorganic material. The planarization layer 117 may include benzocyclobutene (BCB), PI, hexamethyldisiloxane (HMDSO), polymethylmethacrylate (PMMA), or a general-purpose polymer, such as polystyrene (PS), a polymer derivate having a phenol-based group, an acryl-based polymer, an imide-based polymer, an arylether-based polymer, an amide-based polymer, a fluorine-based polymer, a p-xylene-based polymer, a vinyl alcohol-based polymer, and a blend thereof. The planarization layer 117 may include $SiO_2$, $SiN_x$, SiON, $Al_2O_3$, $TiO_2$, $Ta_2O_5$, $HfO_2$, or $ZnO_2$. After the planarization layer 117 is formed, a chemical mechanical polishing operation may be performed to provide a flat upper surface.

An opening may be included in the planarization layer 117 to expose any of the first source electrode S1 and the first drain electrode D1 of the main thin-film transistor TFT. The first pixel electrode 221 may contact the first source electrode S1 or the first drain electrode D1 through the opening to be electrically connected to the main thin-film transistor TFT.

Also, the planarization layer 117 may include an opening to expose any of the second source electrode S2 and the second drain electrode D2 of the auxiliary thin-film transistor TFT'. The second pixel electrode 221' may contact the second source electrode S2 or the second drain electrode D2 through the opening to be electrically connected to the auxiliary thin-film transistor TFT'.

The first pixel electrode 221 and the second pixel electrode 221' may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the first pixel electrode 221 and the second pixel electrode 221' may include a reflective layer including Ag, Mg, Al, Pt, Pd, Au, Ni, Nd, Ir, Cr, or a compound thereof. According to another embodiment, the first pixel electrode 221 and the second pixel electrode 221' may further include a layer including ITO, IZO, ZnO, or $In_2O_3$ above/below the reflective layer described above. In some embodiments, the first pixel electrode 221, and the second pixel electrode 221' may include a stack structure including ITO/Ag/ITO.

A pixel-defining layer 119 may cover an edge of each of the first pixel electrode 221 and the second pixel electrode 221'. The pixel-defining layer 119 may overlap each of the first pixel electrode 221 and the second pixel electrode 221' and may include a first opening OP1 and a second opening OP2 defining an emission area of a pixel. The pixel-defining layer 119 may increase a distance between edges of the first and second pixel electrodes 221 and 221' and the opposite electrode 223 thereon to prevent the occurrence of arcs, etc., at edges of the first and second pixel electrodes 221 and 221'. The pixel-defining layer 119 may be formed by using a spin coating method, etc., by using an organic insulating material, such as PI, polyamide, acryl resins, BCB, HMDSO, phenol resins, etc.

A first functional layer 222a may be arranged on the first and second pixel electrodes 221 and 221' exposed through the openings OP1 and OP2 of the pixel-defining layer 119. The first functional layer 222a may be arranged to extend onto an upper surface of the pixel-defining layer 119. The first functional layer 222a may include a single layer or multiple layers. The first functional layer 222a may include a hole transport layer (HTL) having a single-layered structure. Alternatively, the first functional layer 222a may include a hole injection layer (HIL) and an HTL. The first functional layer 222a may be formed as a single body to correspond to the main pixels Pm and the auxiliary pixels Pa included in the display area DA and the sensor area SA.

A first emission layer 222b and a second emission layer 222b' formed to correspond to the first pixel electrode 221 and the second pixel electrode 221', respectively, may be arranged on the first functional layer 222a. A first emission layer 222b and a second emission layer 222b' may include a high molecular-weight material or a low molecular-weight material and may emit red, green, blue, or white light.

A second functional layer 222c may be formed on the first emission layer 222b and the second emission layer 222b'. The second functional layer 222c may include a single layer or multiple layers. The second functional layer 222c may include an electron transport layer (ETL) and/or an electron injection layer (EIL). The second functional layer 222c may be formed as a single body to correspond to the main pixels Pm and the auxiliary pixels Pa included in the display area DA and the sensor area SA. The first functional layer 222a and/or the second functional layer 222c may be omitted.

The opposite electrode 223 may be arranged on the second functional layer 222c. The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer, such as ITO, IZO, ZnO, or $In_2O_3$, on the (semi) transparent layer, including the materials described above.

According to the present embodiment, the opposite electrode 223 may include the first opposite electrodes 223A arranged in the display area DA and the second opposite electrodes 223B arranged in the sensor area SA, as described above. Also, the opposite electrode 223 may further include the third opposite electrodes 223 (see FIG. 5).

First opposite electrodes 223A adjacent to each other from among the first opposite electrodes 223A may overlap and contact each other at edges thereof (Region R1 of FIG. 7). The overlapping portion may be formed between the main pixels Pm. Second opposite electrodes 223B adjacent to each other from among the second opposite electrodes 223B may overlap and contact each other at the projections PT thereof (Region R2 of FIG. 8). A thickness of the opposite electrode 223 at the overlapping portion may be greater than a thickness of each of the first opposite electrodes 223A at a central portion thereof.

One or more second opposite electrodes 223B may be arranged to be apart from each other with the transmission portion TA therebetween in the sensor area SA. Here, a distance by which the second opposite electrodes 223B are apart from each other may be the opening 223OP of the opposite electrode 223. The opening 223OP may include the transmission hole TAH through which light is transmitted. A width Wt of the transmission hole TAH may be greater than a width Wa of an emission area defined as a second opening OP2 of the pixel-defining layer 119.

That the transmission hole TAH is formed may denote that a member, such as the opposite electrode 223, etc., is removed in correspondence with the transmission area TA. Thus, the light transmittance may be significantly increased in the light transmission area TA.

Although not shown in FIGS. 7 and 8, a capping layer may be formed on the opposite electrode 223 to protect the opposite electrode 223 and improve the light extraction efficiency. The capping layer may include LiF. Alternatively, the capping layer may include an inorganic insulating material, such as $SiN_x$, and/or an organic insulating material. In some embodiments, the capping layer may be omitted.

Figure 9:
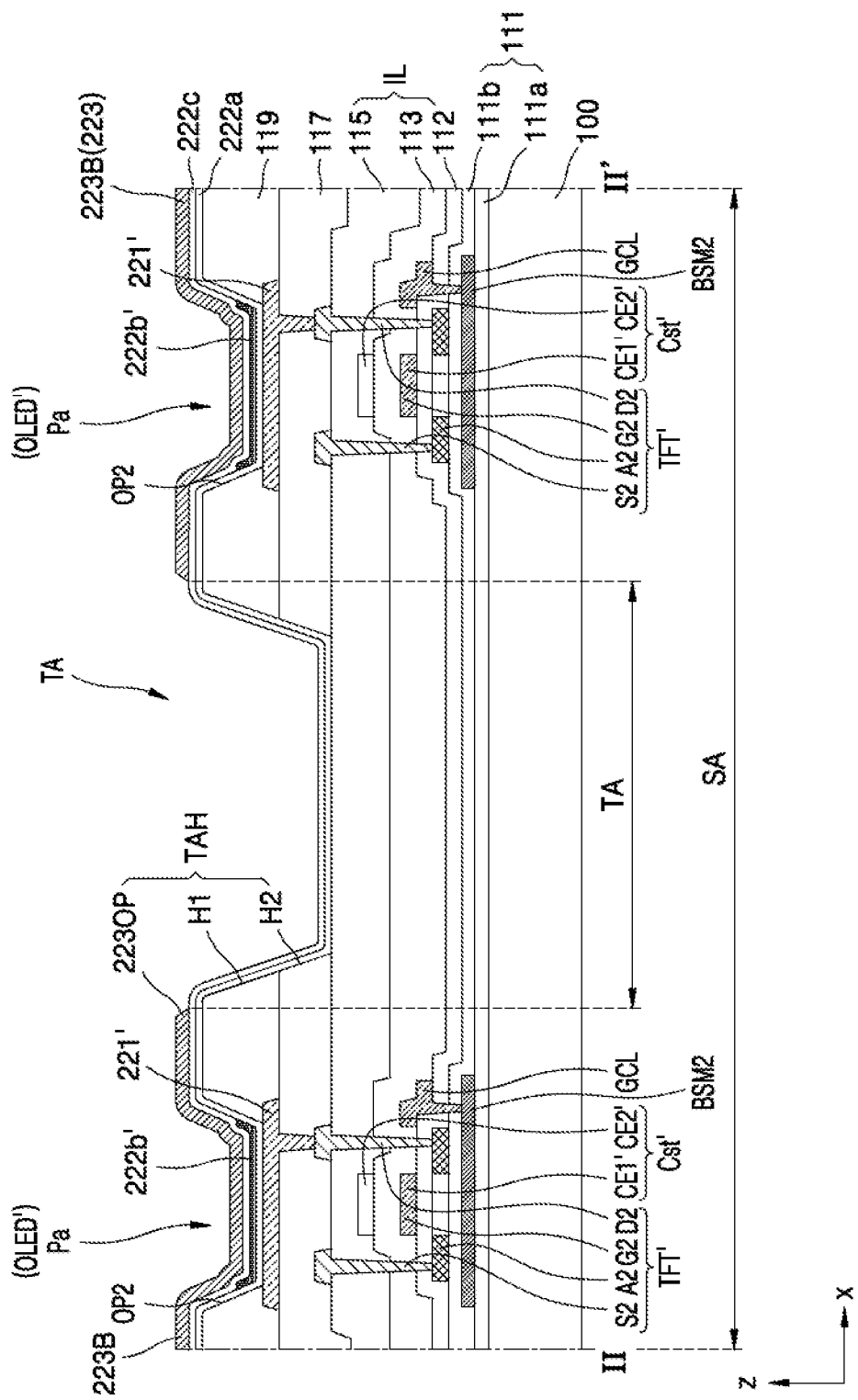
FIG. 9 is a cross-sectional view schematically illustrating a display apparatus according to another embodiment.
Figure 10:
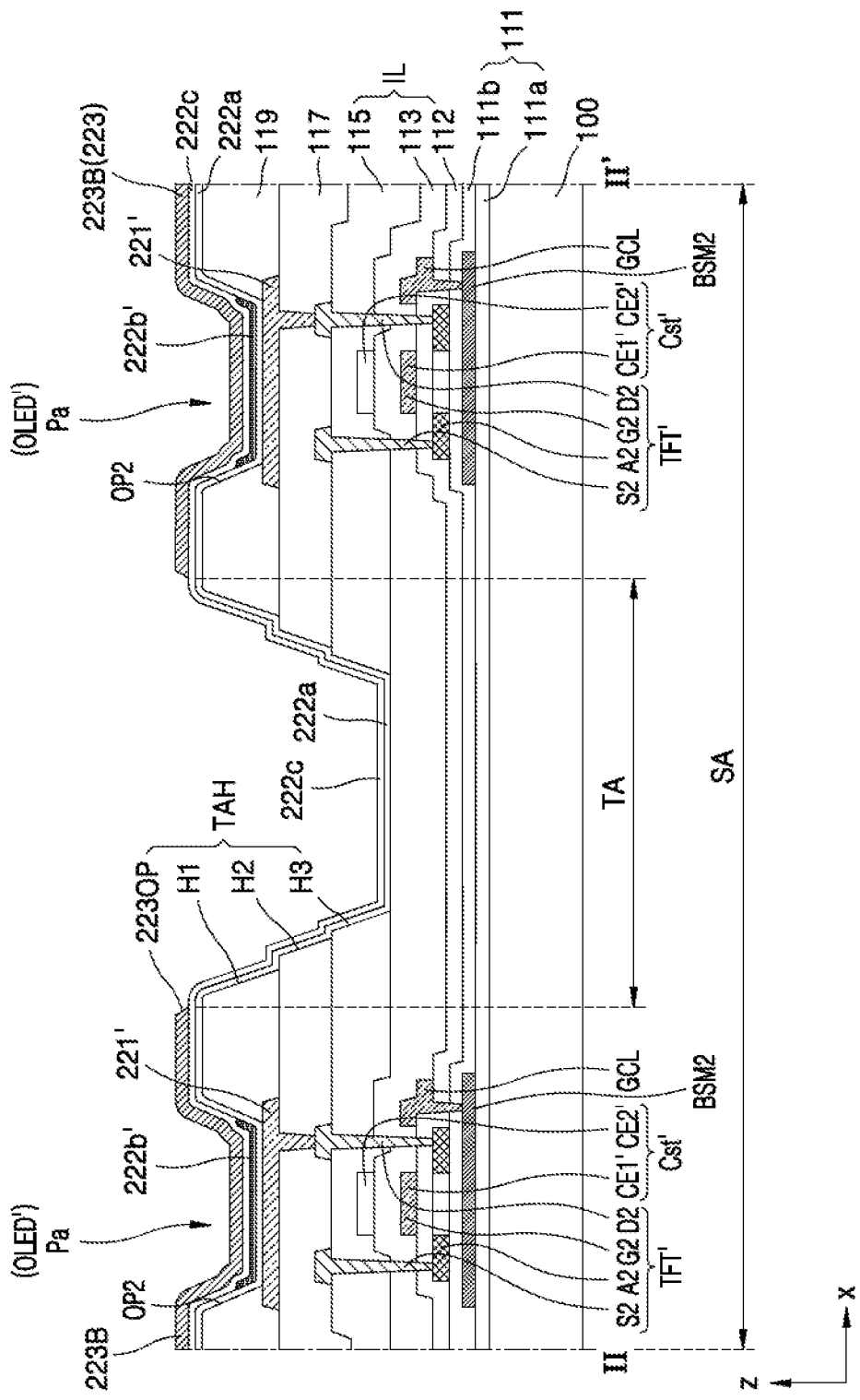
FIG. 10 is a cross-sectional view schematically illustrating a display apparatus according to another embodiment.

FIGS. 9 and 10 are schematic cross-sectional views of a display apparatus according to another embodiment. FIGS. 9 and 10 may correspond to line II-II' of FIG. 5. In FIGS. 9 and 10, reference numerals that are the same as the reference numerals in FIG. 8 denote the members that are the same as the members in FIG. 8. Thus, their descriptions will not be repeated.

FIG. 8 illustrates that the transmission hole TAH includes the opening 223OP of the opposite electrode 223. However, embodiments are not limited thereto.

Referring to FIG. 9, the transmission hole TAH may further include a first hole H1 defined in the pixel-defining layer 119 and/or a second hole H2 defined in the planarization layer 117.

The pixel-defining layer 119 may have the first hole H1 to correspond to the transmission area TA. The first hole H1 may be arranged to overlap the opening 223OP of the opposite electrode 223. In the drawing, it is illustrated that a lower width of the opening 223OP is greater than a lower width of the first hole H1. However, embodiments are not limited thereto. For example, the opposite electrode 223 may extend to an inner sidewall of the transmission hole TAH so that the width of the opening 223OP may be less than the width of the first hole H1.

The planarization layer 117 may have the second hole H2 to correspond to the transmission area TA. The second hole H2 may be arranged to overlap the opening 223OP of the opposite electrode 223. In the drawing, it is illustrated that a lower width of the first hole H1 is greater than a lower width of the second hole H2. However, embodiments are not limited thereto. For example, the pixel-defining layer 119 may cover an edge of the second hole H2 of the planarization layer 117 so that the width of the first hole H1 may be less than the width of the second hole H2.

Because the first hole H1 and/or the second hole H2 are/is formed, the light transmittance of the transmission area TA may further be improved. In the drawing, it is illustrated that both the first hole H1 and the second hole H2 are formed. However, embodiments are not limited thereto. For example, various modifications are possible. For example, one of the first hole H1 and the second hole H2 may be included to correspond to the transmission area TA. The first functional layer 222a and the second functional layer 222c may be arranged inside the transmission hole TAH.

Referring to FIG. 10, the transmission hole TAH may further include a third hole H3 corresponding to the transmission area TA.

When the first gate insulating layer 112, the second gate insulating layer 113, and the interlayer insulating layer 115 are commonly referred to as an inorganic insulating layer IL, the inorganic insulating layer IL may have a third hole H3 corresponding to the transmission area TA. The third hole H3 may be formed to expose an upper surface of the buffer layer 111 or the substrate 100. A first opening of the first gate insulating layer 112, a second opening of the second gate insulating layer 113, and a third opening of the interlayer insulating layer 115 may overlap one another, thereby forming the third hole H3. The first through third openings being formed to correspond to the transmission area TA. The first through third openings may be separately formed in separate processes or simultaneously formed in the same process. Alternatively, the first opening and the second opening may be simultaneously formed, and the third opening may be separately formed. As such, various modifications are possible. When the first through third openings are formed in separate processes, a step difference may be formed at a side surface of the third hole H3.

The inorganic insulating layer IL may include a groove, rather than the third hole H3 exposing the buffer layer 111. For example, the first gate insulating layer 112 of the inorganic insulating layer IL may be continually arranged to correspond to the transmission area TA and the second gate insulating layer 113. Additionally, the interlayer insulating layer 115 may respectively have the second opening and the third opening to correspond to the transmission portion TA.

Alternatively, the first gate insulating layer 112 and the second gate insulating layer 113 may be continually arranged to correspond to the transmission area TA. Additionally, the interlayer insulating layer 115 may include the third opening to correspond to the transmission area TA. As such, various modifications are possible.

According to the present embodiments, layers including the inorganic insulating layer IL, the planarization layer 117, and the pixel-defining layer 119 may have sufficient transmittance of light to allow the component 20 to transmit and receive light. Thus, the inorganic insulating layer IL, the planarization layer 117, the pixel-defining layer 119 may not include holes corresponding to the transmission portion TA. However, when the inorganic insulating layer IL, the planarization layer 117, and the pixel-defining layer 119 include the holes corresponding to the transmission area TA, the light transmittance may further be improved.

Figure 11:
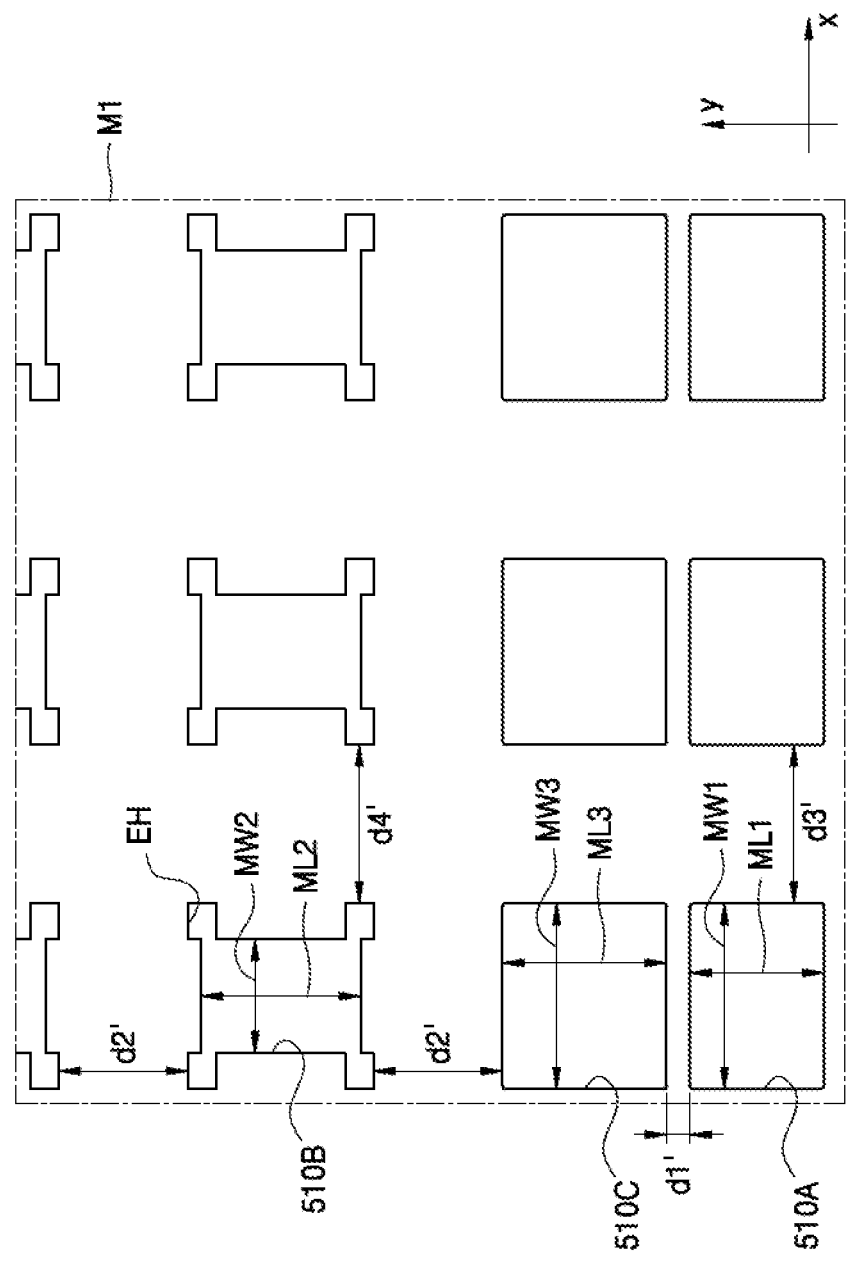
FIG. 11 illustrates an example of a mask for forming an opposite electrode according to embodiments.
Figure 12A:
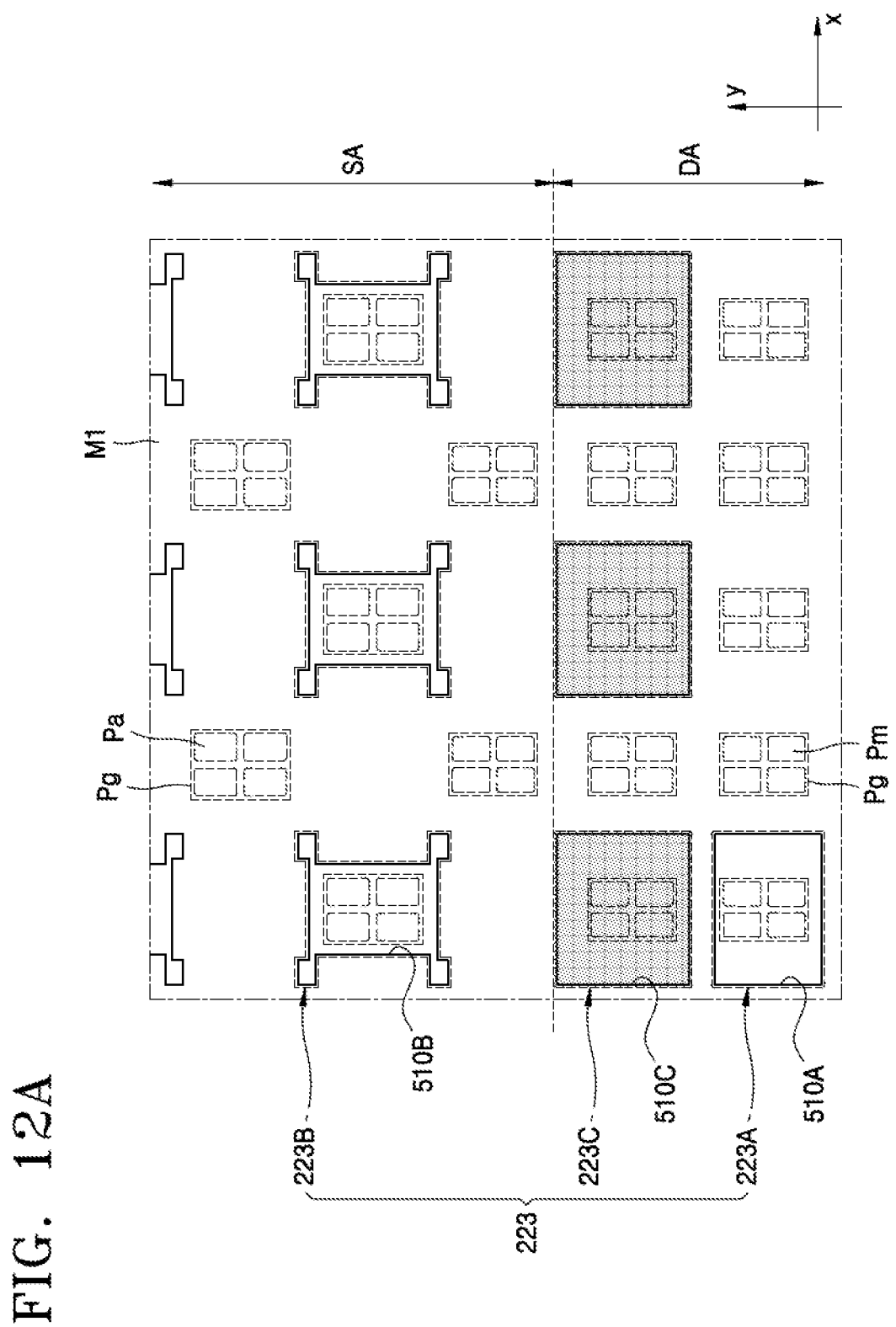
FIGS. 12A and 12B illustrate a method of manufacturing a display apparatus, according to an embodiment.
Figure 12B:
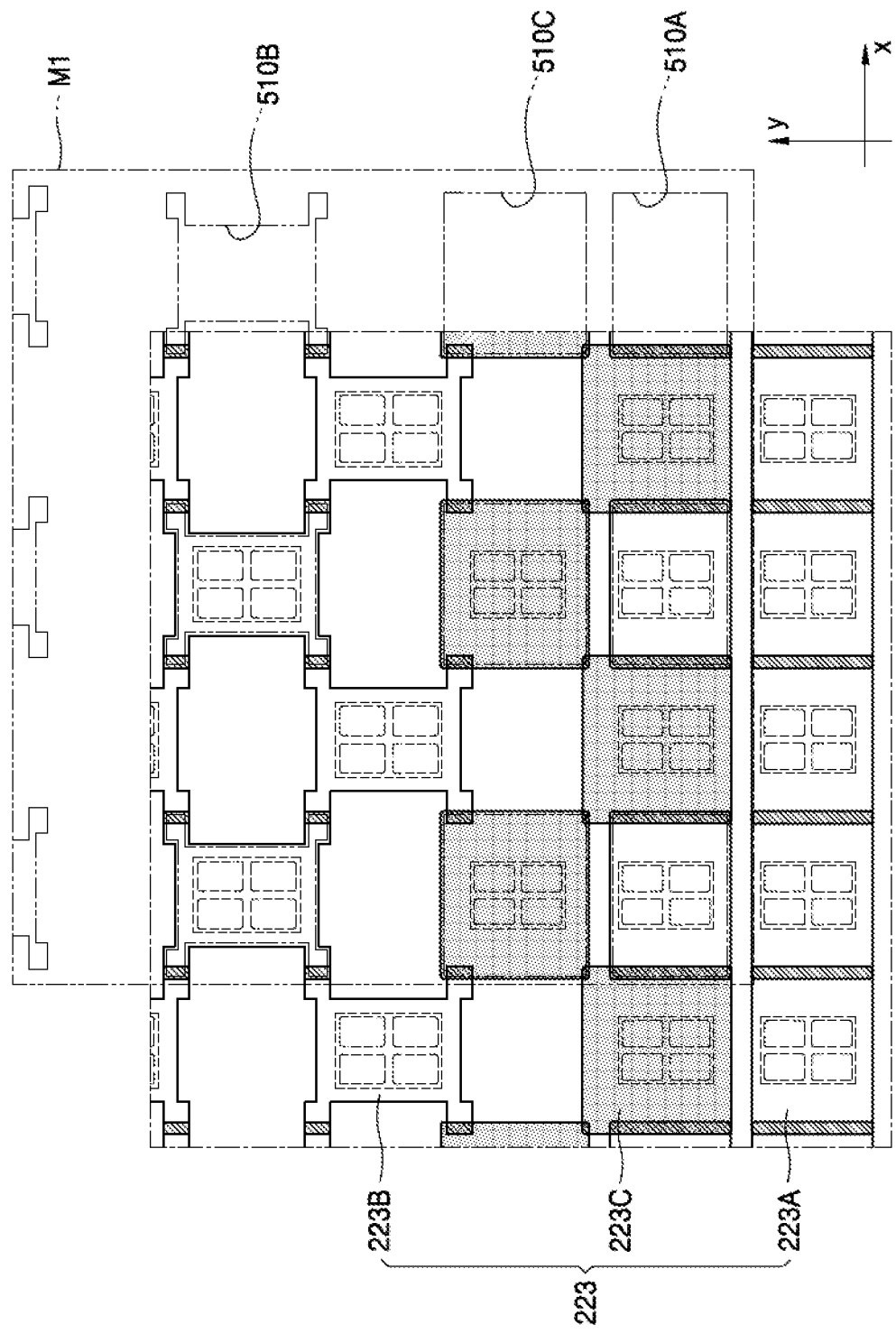

FIG. 11 illustrates an example of a mask M1 for forming an opposite electrode according to embodiments and FIGS. 12A and 12B illustrate a manufacturing method using the mask M1.

Referring to FIG. 11, the mask M1, according to an embodiment, may include a first mask opening 510A and a second mask opening 510B having different shapes from each other. Also, the mask M1, according to an embodiment, may further include a third mask opening 510C having a different size from the first mask opening 510A.

The first mask opening 510A may have a shape of a quadrangle with a first mask width MW1 in a first direction (an x-direction) and a first mask length ML1 in a second direction (a y-direction).

The second mask opening 510B may include an opening having a shape of a quadrangle with a second mask width MW2 in the first direction (the x-direction) and a second mask length ML2 in the second direction (the y-direction), and may further include an extension hole EH extending from a vertex of the opening. The second mask width MW2 may denote a width in the first direction (the x-direction) crossing a center of the second mask opening 510B.

The third mask opening 510C may have a shape of a quadrangle with a third mask width MW3 in the first direction (the x-direction) and a third mask length ML3 in the second direction (the y-direction).

Here, the first mask width MW1 may be greater than the second mask width MW2. The first mask width MW1 may be substantially the same as the third mask width MW3. The third mask length ML3 may be greater than the first mask length ML1. An area of the third mask opening 510C may be greater than an area of the first mask opening 510A.

The first mask opening 510A, the third mask opening 510C, and the second mask opening 510B may be sequentially arranged in the second direction (the y-direction).

The first mask opening 510A may be arranged to be apart from the third mask opening 510C by a first distance d1'. The third mask opening 510C may be arranged to be apart from the second mask opening 510B by a second distance d2'. Here, the second distance d2' may be greater than the first distance d1'. In some embodiments, the second distance d2' may be about five to ten times the first distance d1' (d2'>d1').

Second mask openings 510B may further be arranged in a positive(+) y-direction to be apart from each other by the second distance d2' and first mask openings 510A may further be arranged in a negative(−) y-direction to be apart from each other by the first distance d1'.

The first mask opening 510A may be provided in a multiple number and may be serially arranged in the first direction to be apart from each other by a third distance d3'. The second mask opening 510B may be provided in a multiple number and may be serially arranged in the first direction to be apart from each other by a fourth distance d4'. Here, the fourth distance d4' may denote a shortest distance between the second mask openings 510B. The third mask opening 510C may be provided in a multiple number and may be serially arranged in the first direction to be apart from each other by the third distance d3'.

Here, the third distance d3' and the fourth distance d4' may be less than the first mask width MW1.

The mask M1, according to the present embodiment, may include a mask used for depositing the opposite electrode 233 (see FIG. 5) and may include a fine metal mask (FMM). The FMM may be manufactured by forming a hole in a metal plate and stretching the metal plate. Accordingly, each of the first mask opening 510A, the second mask opening 510B, and third mask opening 510C may be symmetrically formed based on an axis in the first direction and an axis in the second direction. The axis in the first direction crosses a center of each of the first mask opening 510A, the second mask opening 510B, and third mask opening 510C. The axis of the second direction crosses the center of each of the first mask opening 510A, the second mask opening 510B, and third mask opening 510C.

The first mask opening 510A may be included to form the first opposite electrode 223A, and a size of the first mask opening 510A may be less than or equal to a size of the first opposite electrode 223A. The second mask opening 510B may be included to form the second opposite electrode 223B, and a size of the second mask opening 510B may be less than or equal to a size of the second opposite electrode 223B. The third mask opening 510C may be included for forming the third opposite electrode 223C, and a size of the third mask opening 510C may be less than or equal to a size of the third opposite electrode 223C.

According to the present embodiment, a deposition process using one mask M1 may be used to form the opposite electrode 223. FIGS. 12A and 12B illustrate a method of depositing the opposite electrode 223 by using the mask M1.

Referring to FIG. 12A, after forming the second functional layer 223c (see FIG. 7) on the substrate 100, the first mask opening 510A, the second mask opening 510B, and third mask opening 510C may be arranged to correspond to one or more pixel groups Pg.

Thereafter, a deposition material for forming the opposite electrode may be released by using a deposition source (not shown) to primarily deposit a portion of the opposite electrode 223 on the second functional layer 222c. Here, the first opposite electrode 223A, second opposite electrodes 223B, and third opposite electrode 223C may be partially formed according to the arrangement of the first mask opening 510A, the second mask opening 510B, and third mask opening 510C of the mask M1.

Next, as illustrated in FIG. 12B, after arranging the mask M1 by moving the position of the mask M1 in the x-direction and the y-direction, a remaining portion of the opposite electrode 223 may be secondarily deposited. The portion of the first opposite electrode 223A, second opposite electrodes 223B, and third opposite electrode 223C, the portion being formed by the secondary deposition may overlap and contact the portion of the first opposite electrode 223A, second opposite electrodes 223B, and third opposite electrode 223C, the portion being formed by the primary deposition.

In FIG. 12B, after the opposite electrode 223 is primarily deposited, the opposite electrode 223 may be secondarily deposited by arranging the mask M1 in the right and upper direction by 45 degrees. However, embodiments are not limited thereto. After the opposite electrode 223 is primarily deposited, the opposite electrode 223 may be secondarily deposited by arranging the mask M1 in the left and lower direction by −45 degrees.

When the mask M1 according to the embodiment is used, the opposite electrode 223 may be deposited twice by using one mask M1. Thus, process time and costs may be reduced compared to process time and costs of a method using two masks.

Figure 13:
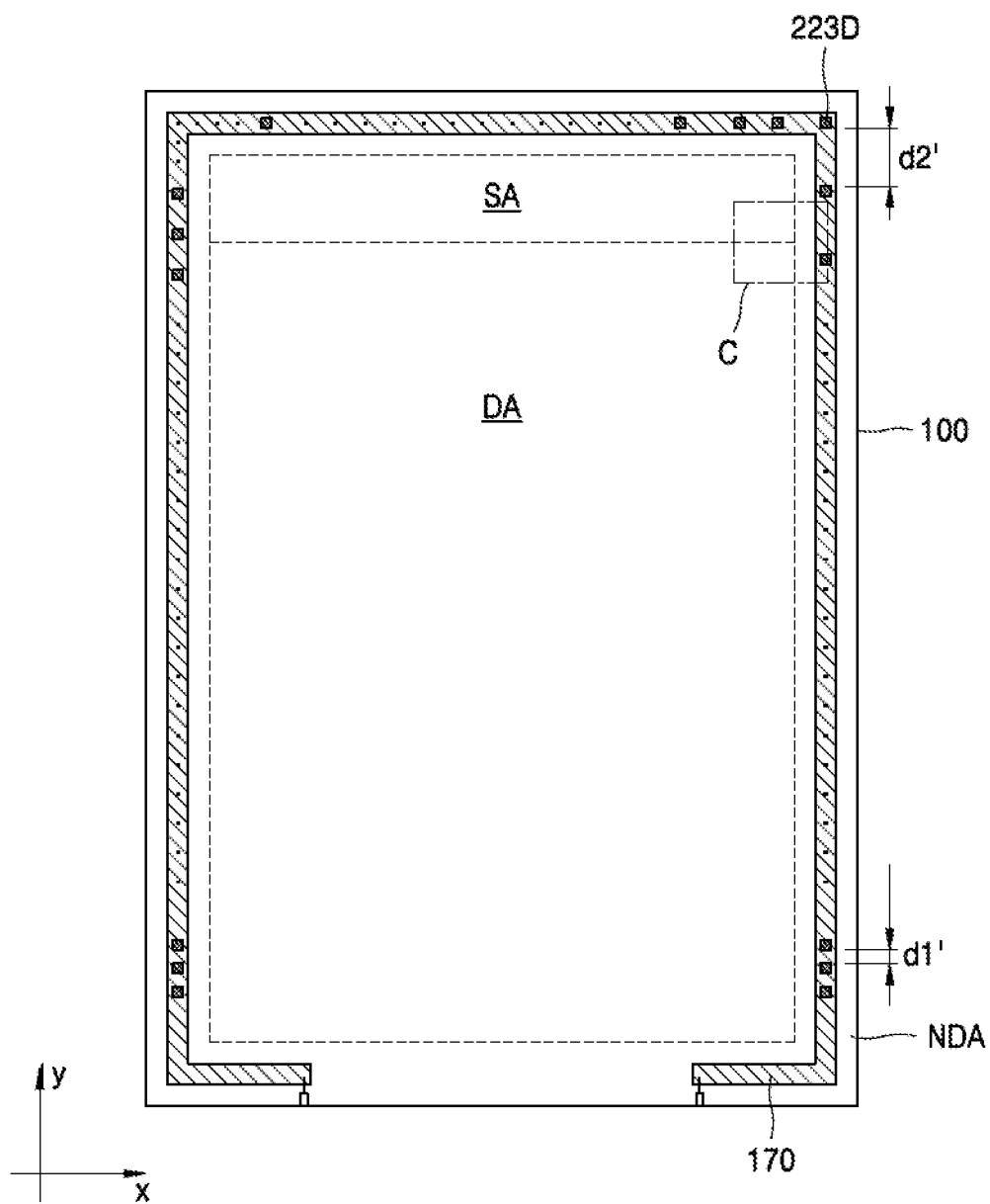
FIG. 13 is a plan view schematically illustrating a display apparatus according to another embodiment.
Figure 14:
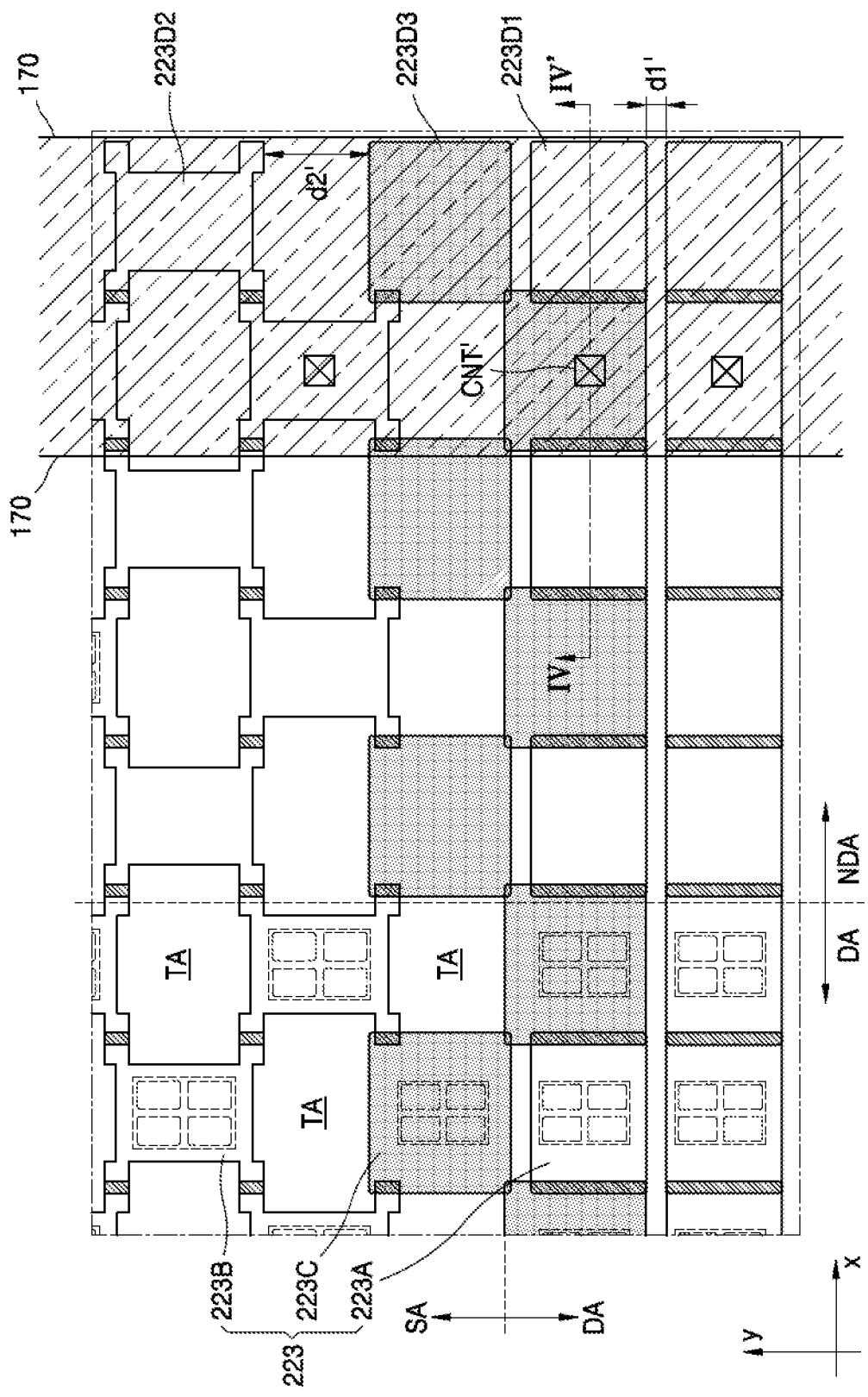
FIG. 14 is an enlarged view of region C of FIG. 13.

As illustrated in FIG. 14, according to the embodiments, when the display apparatuses are formed by using the deposition method, exterior patterns 223D may be included at an outermost portion of the opposite electrode 223 formed in the non-display area NDA. In this specification, the exterior patterns 223D denote patterns formed at the outermost portion of the opposite electrode 223. The exterior patterns 223D may be included in the opposite electrode 223, and FIG. 13 illustrates some of the exterior patterns 223D.

Referring to FIG. 13, the exterior patterns 223D may be arranged to overlap the second power supply line 170 and may be arranged to be apart from each other by a distance d1' or d2'.

The distances d1' and 2' between the exterior patterns 233D may be variously configured. The distance d1' between the exterior patterns 223D arranged to be adjacent to the display area DA may be less than the distance d2' between the exterior patterns 223D arranged to be adjacent to the sensor area SA.

Figure 15:
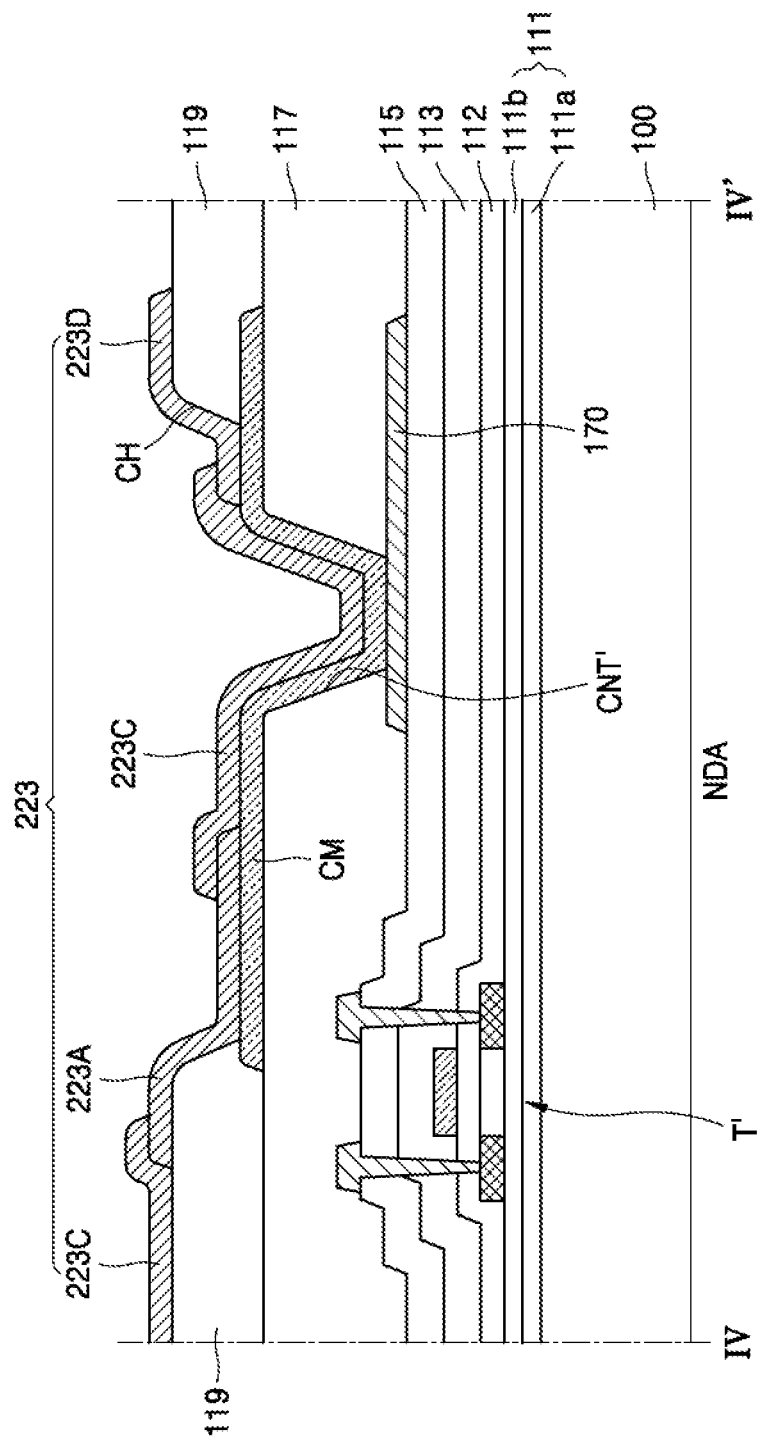
FIG. 15 is a schematic cross-sectional view of the display apparatus taken along line IV-IV' of FIG. 14.

FIG. 14 is an enlarged view of region C of FIG. 13 and FIG. 15 is a schematic cross-sectional view of a display apparatus taken along line IV-IV' of FIG. 14. In FIGS. 14 and 15, reference numerals that are the same as the reference numerals in FIGS. 5 and 7 denote the members that are the same as the members in FIGS. 5 and 7. Thus, their descriptions will not be repeated.

Referring to FIG. 14, the opposite electrode 223 may be arranged to extend to the non-display area NDA. The opposite electrode 223 may include the first opposite electrode 223A, the second opposite electrode 223B, and the third opposite electrode 223C. Thus, in the non-display area NDA, the first opposite electrode 223A, the second opposite electrode 223B, and the third opposite electrode 223C may be arranged.

The second opposite electrodes 223B and/or the third opposite electrodes 223C may be arranged in the non-display area NDA outside the sensor area SA. The transmission areas TA may be defined by distances between the second opposite electrodes 223B and the third opposite electrodes 223C. The second opposite electrodes 223B and the third opposite electrodes 223C may be arranged to overlap and contact each other. Thus, the same voltage may be applied to the second opposite electrodes 223B and the third opposite electrodes 223C.

The first opposite electrodes 223A and/or the third opposite electrodes 223C may be arranged in the non-display area NDA outside the display area DA. The first opposite electrodes 223A and the third opposite electrodes 223C may be arranged to overlap and contact each other. Thus, the same voltage may be applied to the first opposite electrodes 223A and the third opposite electrodes 223C.

Exterior patterns 223D1, 223D2, and 223D3 arranged at the outermost portions in the first direction (the x-direction) may have different shapes and may be arranged to be apart from each other by the distance d1' or d2'. Thus the opposite electrode 223 may have an amorphous saw-toothed shape. Alternatively, it may be understood that a side of the opposite electrode 223 includes the partially projecting exterior patterns 223D1, 223D2, and 223D3. For example, from a planar perspective, a side of the opposite electrode 223 may not have a linear shape.

The opposite electrode 223 may be electrically connected to the second power supply line 170 and may receive a second power voltage ELVSS (or a common voltage).

Referring to FIG. 15, a thin-film transistor t' which may be included in the scan driving circuit 120 (see FIG. 3) may be arranged between the display area DA and the second power supply line 170. The planarization layer 117 and the pixel-defining layer 119 may be arranged on the thin-film transistor T'. Thus, the thin-film transistor T1' may be arranged to be apart from the opposite electrode 223.

The second power supply line 170 may be arranged on the same layer as a source electrode or a drain electrode of the thin-film transistor T'. The second power supply line 170 may include the same material as the source electrode or the drain electrode of the thin-film transistor T'. The planarization layer 117 may be arranged on the second power supply line 170. Additionally, the planarization layer 117 may have a contact hole CNT' exposing a portion of the second power supply line 170.

A connection wire CM arranged on the same layer and including the same material as the first pixel electrode 221 (see FIG. 7) may be arranged on the planarization layer 117. The connection wire CM may contact the second power supply line 170 through the contact hole CNT'.

The pixel-defining layer 119 may be arranged on the connection wire CM, and the pixel-defining layer 119 may include a connection opening CH exposing a portion of the connection wire CM. A portion of the opposite electrode 223 may be arranged in the connection opening CH and may contact the connection wire CM.

The opposite electrode 223 may include the first opposite electrodes 223A, the second opposite electrodes 223B, and/or the third opposite electrodes 223C. Thus, there may be an overlapping area in which the first opposite electrodes 223A, the second opposite electrodes 223B, and/or the third opposite electrodes 223C overlap one another. A thickness of the opposite electrode 223 at the overlapping area may be a greater thickness than that of the same at an area in which the first opposite electrodes 223A, the second opposite electrodes 223B, and/or the third opposite electrodes 223C do not overlap one another.

The exterior pattern 223D1 arranged at the outermost portion of the opposite electrode 223 may be arranged to at least partially overlap the second power supply line 170. Also, a portion of the opposite electrode 223 may be arranged to correspond to the contact hole CNT'.

Figure 16:
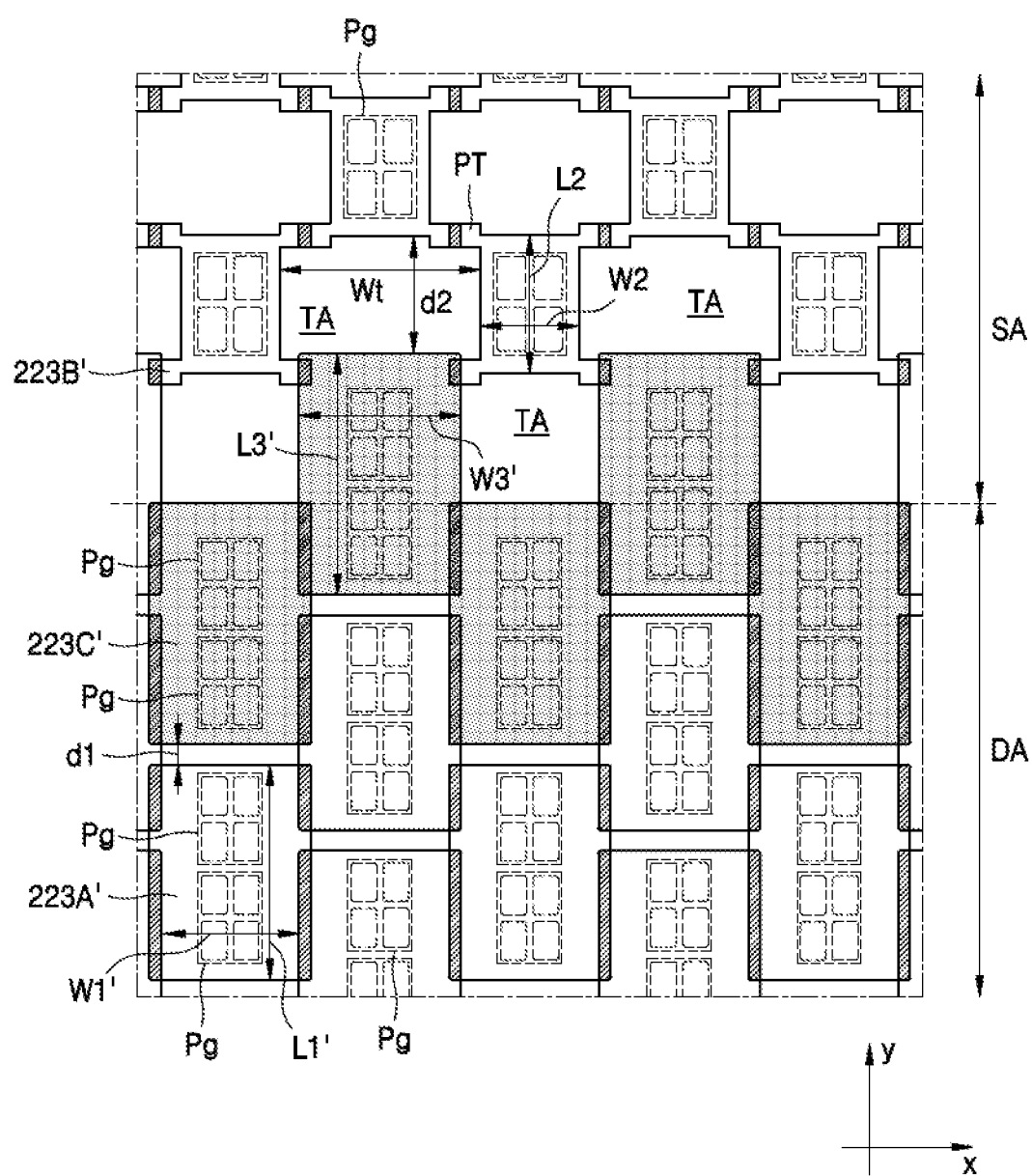
FIG. 16 is a schematic plan view of a portion of a display apparatus according to another embodiment.

FIG. 16 is a schematic plan view of a portion of a display apparatus according to another embodiment. In FIG. 16, reference numerals that are the same as the reference numerals in FIGS. 5 and 6 denote the members that are the same as the members in FIGS. 5 and 6. Thus, their descriptions will not be repeated.

Referring to FIG. 16, the display apparatus, according to an embodiment may include the display area DA and the sensor area SA including the transmission area TA and may include a plurality of opposite electrodes 223. The opposite electrodes 223 may include a plurality of first opposite electrodes 223A' arranged to correspond to the display area DA and a plurality of second opposite electrodes 223B' arranged to correspond to the sensor area SA. Additionally, a shape of the plurality of first opposite electrodes 223A' may be different from a shape of the plurality of second opposite electrodes 223B'.

Also, the display apparatus may further include a plurality of third opposite electrodes 223C' arranged to be adjacent to an edge of the display area DA and the sensor area SA. For example, the third opposite electrodes 223C' may be arranged between the first opposite electrodes 223A' and the second opposite electrodes 223B'.

According to the present embodiment, each of the first opposite electrodes 223A' and the third opposite electrodes 223C' may be arranged to correspond to two pixel groups Pg and the second opposite electrodes 223B' may be arranged to correspond to one pixel group Pg. For example, it may be understood that the number of pixels to which one first opposite electrode 223A' corresponds may be about two times the number of pixels to which one second opposite electrode 223B' corresponds. For example, when the number of pixels included in one pixel group Pg is four, one second opposite electrode 223B' may be arranged to correspond to four pixels and one first opposite electrode 223A' and one third opposite electrode 223C' may be arranged to correspond to eight pixels.

According to the present embodiment, each of the first opposite electrodes 223A' may have a shape of a first quadrangle with a first width W1' in the first direction (the x-direction). Each of the second opposite electrodes 223B' may have a shape of a second quadrangle with a second width W2' in the first direction (the x-direction), wherein projections PT project at four vertexes of the second quadrangle. Here, the projections PT may be an area overlapping the second opposite electrode 223B' adjacent thereto and may be smaller than the second quadrangle.

In some embodiments, an area of one third opposite electrode 223C' may be greater than an area of one first opposite electrode 223A'. To this end, in FIG. 14, a third length L3' of the third opposite electrode 223C' in the second direction may be greater than a first length L1' of the first opposite electrode 223A' in the second direction. Because the third length L3' is greater than the first length L1', the third opposite electrode 223C' arranged in the sensor area SA may overlap and contact the first opposite electrode 223A' and the second opposite electrode 223B' at a vertex area. A third width W3' in the first direction (the x-direction) is substantially the same as the first width W1' in the drawing. However, embodiments are not limited thereto. For example, the third width W3' may be greater than the first width W1'. According to the present embodiment, the first length L1' may be about one point eight to two times the second length L2, which is a central length of the second opposite electrode 223B in the second direction.

A distance d1 between first opposite electrodes 223A adjacent to each other in the second direction (the y-direction) from among the first opposite electrodes 223A may be much less than the length d2 of the transmission area TA in the second direction (the y-direction). For example, the length d2 of the transmission area TA may be about five to ten times the distance d1 (d1<<d2). In some embodiments, the distance d1 may be about 10 um to about 20 um.

The first opposite electrodes 223A' may be arranged in a zigzag shape in the first direction. Accordingly, the total number of first opposite electrodes 223A' and/or third opposite electrodes 223C' contacting one first opposite electrode 223A' may be four.

The third opposite electrodes 223C' may be arranged in a zigzag shape in the first direction. Accordingly, one third opposite electrode 223C' may be connected to an adjacent third opposite electrode 223C' and the first opposite electrode 223A', or may contact the first opposite electrode 223A' and the second opposite electrode 223B'.

As the number of first opposite electrodes 223A', second opposite electrodes 223B', third opposite electrodes 223C' contacting one first opposite electrode 223A' and one third opposite electrode 223C' is increased, a more uniform second power voltage may be provided to the display area DA. Accordingly, a deviation of brightness in the display area DA may be decreased.

Figure 17:
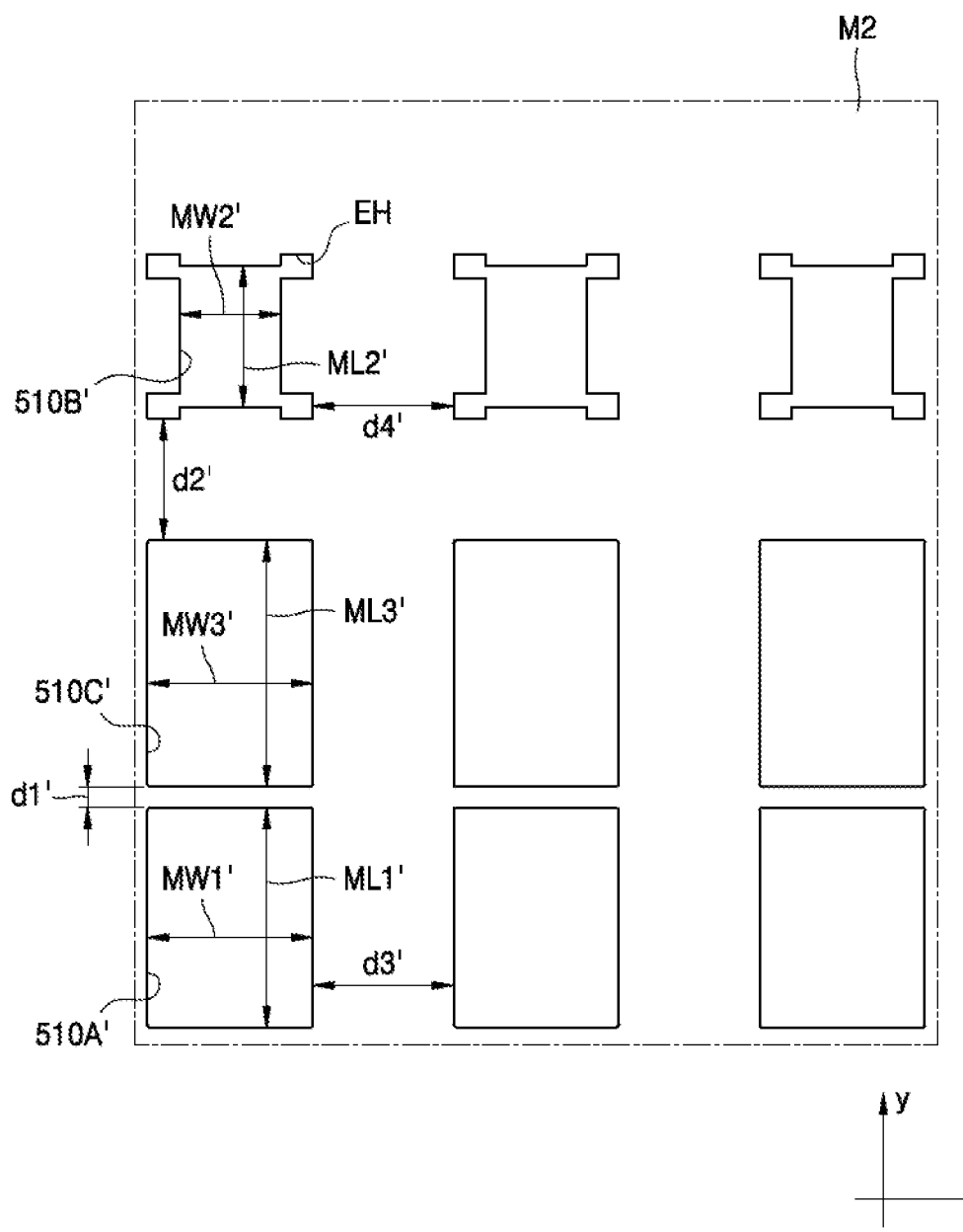
FIG. 17 illustrates another example of a mask for forming an opposite electrode according to embodiments.

FIG. 17 illustrates a mask M2 for manufacturing the display apparatus of FIG. 16. In FIG. 17, reference numerals that are the same as the reference numerals in FIG. 11 denote the members that are the same as the members in FIG. 11. Thus, their descriptions will not be repeated.

Referring to FIG. 17, the mask M2, according to an embodiment, may include a first mask opening 510A' and the second mask opening 510B' having different shapes from each other. Also, the mask M2, according to an embodiment, may further include a third mask opening 510C' having a different size from the first mask opening 510A'.

The first mask opening 510A' may have a shape of a quadrangle with a first mask width MW1' in a first direction (an x-direction) and a first mask length ML1' in a second direction (a y-direction).

The third mask opening 510C' may have a shape of a quadrangle with a third mask width MW3' in the first direction (the x-direction) and a third mask length ML3' in the second direction (the y-direction).

Here, the third mask length ML3' may be greater than the first mask length ML1'. An area of the third mask opening 510C' may be greater than an area of the first mask opening 510A'. The third mask length ML3' may be equal to or greater than two times the second mask length ML2' of the second mask opening 510B'. The first mask length ML1' may be about 1.8 times to about 2 times the second mask length ML2' of the second mask opening 510B'.

The first mask opening 510A', the third mask opening 510C', and the second mask opening 510B' may be sequentially arranged in the second direction (the y-direction).

The first mask opening 510A' may be arranged to be apart from the third mask opening 510C' by a first distance d1'. The third mask opening 510C' may be arranged to be apart from the second mask opening 510B' by a second distance d2'. Here, the second distance d2' may be greater than the first distance d1'. In some embodiments, the second distance d2' may be about five to ten times the first distance d1' (d2'>d1').

The second mask openings 510B' may further be arranged in a positive(+) y-direction to be apart from each other by the second distance d2'. The first mask openings 510A' may further be arranged in a negative(−) y-direction to be apart from each other by the first distance d1'.

The first mask opening 510A' may be provided in a multiple number and the first mask openings 510A' may be serially arranged in the first direction (x-direction) to be apart from each other by a third distance d3'. The third mask opening 510C' may be provided in a multiple number and the third mask openings 510C' may be serially arranged in the first direction (x-direction) to be apart from each other by the third distance d3'.

Here, the third distance d3' may be less than the first mask width W1'.

The opposite electrode 223 according to the embodiment of FIG. 16 may be deposited by primarily depositing the opposite electrode 223 by using the mask M2 according to the present embodiment and then secondarily depositing the opposite electrode 223 by moving the mask M2 in the right and upper or the left and lower direction by 45 degrees.

Figure 18:
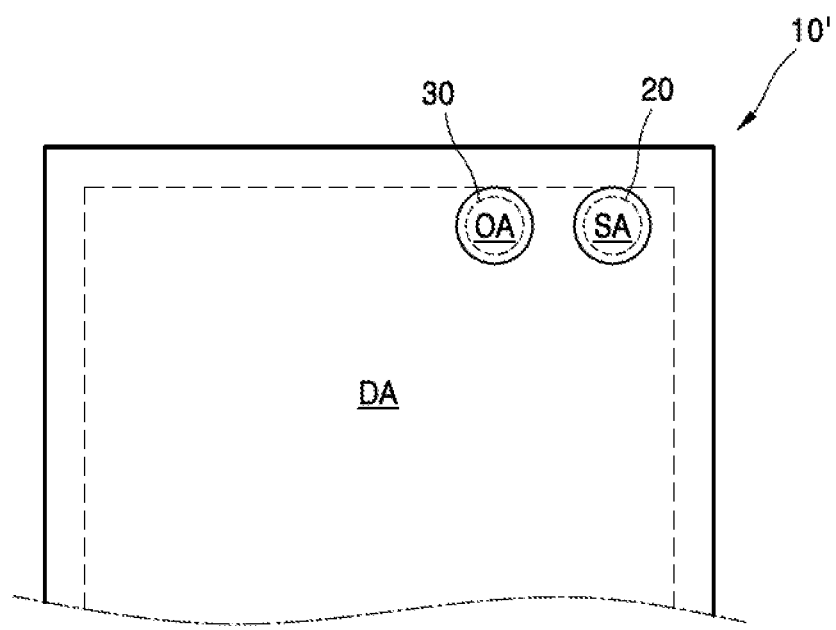
FIG. 18 is a plan view of a portion of a display panel according to another embodiment.

FIG. 18 is a plan view of a portion of a display panel 10' according to another embodiment.

Referring to FIG. 18, the display panel 10' may further include an opening area OA. Additionally, the sensor area SA may be disposed inside the display area DA and may be surrounded by the display area DA.

The opening area OA may be an area below which a component 30 may be arranged. The opening area OA may be a transmission area through which light output from the component 30 to the outside or proceeding from the outside toward the component 30 may be transmitted. According to an embodiment, when light is transmitted through the opening area OA, a light transmittance may be equal to or greater than about 50%. The light transmittance may be equal to or greater than about 70%, about 75%, about 80%, about 85%, or about 90%. The opening area OA may be an area in which a display element is not arranged not to provide an image. According to the present embodiment, the opening area OA may be disposed inside the display area DA, so that main pixels may be arranged to surround the opening area OA.

The component 30 may also be arranged below the sensor area SA. Also, auxiliary pixels may be arranged in the sensor area SA. Thus, a certain image may be provided in the sensor area SA.

In some embodiments, light transmittance of the opening area OA may be greater than a light transmittance of the sensor area SA. Accordingly, the component 30, such as a camera, etc., which may have a high light transmittance, may be arranged in the opening area OA, and a sensor configured to sense infrared rays may be arranged in the sensor area SA.

As described above, according to the one or more of the above embodiments, in the display apparatus, the pixel portion, and the transmission area having improved light transmittance may be arranged in the sensor area SA corresponding to the component, such as the sensor, etc. Thus, an environment for the operation of the component may be generated, while an image may be realized in the area overlapping the component.

Thus, the display apparatus having various functions and improved quality may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a display area and a sensor area, the sensor area including a transmission area;
a plurality of pixel electrodes disposed on the substrate and a plurality of emission layers each disposed on a corresponding one of the plurality of pixels electrodes;
a plurality of first opposite electrodes each disposed on a corresponding one of the plurality of emission layers in the display area; and
a plurality of second opposite electrodes each disposed on a corresponding one of the plurality of emission layers in the sensor area and to surround the transmission area,
wherein a shape of each of the plurality of first opposite electrodes is different from a shape of each of the plurality of second opposite electrodes, wherein the plurality of first opposite electrodes and the plurality of second opposite electrodes are electrically connected to each other.

2. The display apparatus of claim 1, further comprising a plurality of third opposite electrodes between the plurality of first opposite electrodes and the plurality of second opposite electrodes, wherein an area of each of the plurality of third opposite electrodes is greater than an area of each of the plurality of first opposite electrodes.

3. The display apparatus of claim 2, wherein
each of the plurality of first opposite electrodes has a shape of a first quadrangle with a first width in a first direction,
each of the plurality of third opposite electrodes has a shape of a third quadrangle with a third width in the first direction, and
the first width and the third width e substantially the same as each other.

4. The display apparatus of claim 1, wherein
a plurality of main pixels are included in the display area,
a plurality of auxiliary pixels are included in the sensor area, and
a number of the main pixels covered by each of the plurality of first opposite electrodes is equal to a number of the auxiliary pixels covered by each of the plurality of second opposite electrodes.

5. The display apparatus of claim 1, wherein
a plurality of main pixels are included in the display area,
a plurality of auxiliary pixels are included in the sensor area, and
the number of the main pixels covered by each of the plurality of first opposite electrodes is twice the number of the auxiliary pixels covered by each of the plurality of second opposite electrodes.

6. The display apparatus of claim 5, wherein
a length of each of the plurality of first opposite electrodes in a second direction is 1.8 to 2 times a length of each of the plurality of second opposite electrodes in the second direction.

7. The display apparatus of claim 1, wherein
an area of the transmission area is greater than an area of an emission area of an auxiliary pixel arranged in the sensor area.

8. The display apparatus of claim 1, wherein
the transmission area includes a first transmission area and a second transmission area, wherein the first transmission area has a different size from the second transmission area.

9. The display apparatus of claim 1, wherein
a width of the transmission area in a first direction is greater than a width of each of the plurality of second opposite electrodes in the first direction.

10. The display apparatus of claim 1, wherein
the substrate further includes a power supply line arranged in a non-display area outside the display area, and one or more of the plurality of first opposite electrodes and one or more of the plurality of second opposite electrodes are arranged to overlap the power supply line.

11. The display apparatus of claim 1, further comprising a component arranged to correspond to a lower portion of the sensor area.

12. The display apparatus of claim 1, wherein
an auxiliary thin-film transistor is arranged in the sensor area, and
a lower metal layer is arranged between the substrate and the auxiliary thin-film transistor.

13. A display apparatus comprising
a substrate including a display area and a sensor area, the sensor area including a transmission area;
a plurality of first opposite electrodes arranged to correspond to the display area; and
a plurality of second opposite electrodes arranged to correspond to the sensor area and to surround the transmission area,
each of the plurality of first opposite electrodes has a shape of a first quadrangle with a first width in a first direction,
each of the plurality of second opposite electrodes has a shape of a second quadrangle with a second width in the first direction, and wherein projections project from four vertexes of the second quadrangle, and
wherein the shape of each of the plurality of first opposite electrodes is different from the shape of each of the plurality of second opposite electrodes.

14. The display apparatus of claim 13, wherein
the first width is greater than the second width.

15. The display apparatus of claim 13, wherein
first opposite electrodes adjacent to each other in the first direction, from among the plurality of first opposite electrodes, overlap each other at an edge of the first quadrangle, and second opposite electrodes adjacent to each other along an edge of the transmission area, from among the plurality of second opposite electrodes, overlap each other at the projections.

16. The display apparatus of claim 15, wherein first opposite electrodes adjacent to each other in a second direction crossing the first direction, from among the plurality of first opposite electrodes, are arranged to be apart from each other.

17. A display apparatus comprising:
a substrate including a display area and a sensor area with respect to a plan view, e sensor area including at least one transmission area;
a plurality of first opposite electrodes having a first shape and overlapping the display area in the plan view; and
a plurality of second opposite electrodes having a second shape different from the first shape and overlapping the sensor area in the plan view, wherein the at least one transmission area borders the plurality of second opposite electrodes on at least two opposite sides of the transmission area in the plan view,
wherein the second shape comprises a rectangle with a notch on each side, and wherein the notch on at least one side of at least two of the plurality of second opposite electrodes borders the at least one transmission area in the plan view, wherein a portion of the transmission area corresponds to the notch on at least one side of the at least two of the plurality of second opposite electrodes.

18. The display apparatus of claim 17, further comprising:
a plurality of third opposite electrodes having a third shape, wherein each of the plurality of third opposite electrodes borders a boundary between the display area and the sensor area in the plan view and overlaps at least one of the plurality of first opposite electrodes or at least one of the plurality of second opposite electrodes.

\* \* \* \* \*